US009023458B2

(12) United States Patent
Lahav et al.

(10) Patent No.: US 9,023,458 B2
(45) Date of Patent: May 5, 2015

(54) PATTERNING OF IONIC POLYMERS

(75) Inventors: Michal Lahav, Rehovot (IL); Adam Winkleman, Brookline, MA (US); Max Narovlyansky, Cambridge, MA (US); Raquel Perez-Castillejos, Cambridge, MA (US); Emily A. Weiss, Cambridge, MA (US); Leonard N. J. Rodriguez, Cambridge, MA (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 1627 days.

(21) Appl. No.: 12/311,811

(22) PCT Filed: Oct. 18, 2007

(86) PCT No.: PCT/US2007/022219
§ 371 (c)(1),
(2), (4) Date: Jun. 1, 2010

(87) PCT Pub. No.: WO2008/051432
PCT Pub. Date: May 2, 2008

(65) Prior Publication Data
US 2010/0233434 A1 Sep. 16, 2010

Related U.S. Application Data

(60) Provisional application No. 60/853,051, filed on Oct. 19, 2006, provisional application No. 60/853,525, filed on Oct. 20, 2006.

(51) Int. Cl.
*B32B 3/00* (2006.01)
*B05D 3/06* (2006.01)
(Continued)

(52) U.S. Cl.
CPC ............... *G03F 7/0002* (2013.01); *B82Y 10/00* (2013.01); *B82Y 40/00* (2013.01); *Y10T 428/24479* (2015.01)

(58) Field of Classification Search
USPC ............................................ 428/156; 521/30
See application file for complete search history.

(56) References Cited

U.S. PATENT DOCUMENTS 5,466,653 A * 11/1995 Ma et al. .................. 503/200
(Continued)

FOREIGN PATENT DOCUMENTS

EP 0883025 A 12/1998
(Continued)

OTHER PUBLICATIONS

Wang, T., et al., "Manipulating Nanoparticle Size within Polyelectrolyte Multilayers via Electroless Nickel Deposition," Chem. Mater., vol. 15, pp. 299-305 (2003).*
(Continued)

*Primary Examiner* — Peter D. Mulcahy
*Assistant Examiner* — Henry Hu
(74) *Attorney, Agent, or Firm* — Wolf, Greenfield & Sacks, P.C.

(57) ABSTRACT

In one aspect, methods of patterning of thin films of an ionotropic polymer (e.g., poly(acrylic acid)) are provided. These processes can create micron or sub-micron-scale patterns of ionotropic polymers such as cation crosslinked poly(acrylic acid) (CCL-PAA). In one embodiment, patterning may be performed within microfluidic channels by flowing a solution of crosslinking agent (e.g., metal cations such as $Ag^+$, $Ca^{2+}$, $Pd^{2+}$, $Al^{3+}$, $La^{3+}$, and $Ti^{++}$) that can crosslink a portion of an ionotropic polymer in contact with the solution. In another embodiment, methods of patterning ionotropic polymers involve photolithography. Upon patterning a positive photoresist (e.g., diazonaphthoquinone-novolac resin) on a film of CCL-PAA, the exposed regions of CCL-PAA can be etched by an aqueous solution. Advantageously, the patterned, crosslinked polymer may also serve as both a reactant and a matrix for subsequent chemistry. For example, in some embodiments, the initial crosslinking cation can be exchanged for a second cation that could not be patterned photolithographically. Patterned films of CCL-PAA can also be used to host and template the reduction of metallic cations to metallic nanoparticles, and to fabricate porous, low-k dielectric substrates.

6 Claims, 21 Drawing Sheets

(51) Int. Cl.
  *B82Y 10/00* (2011.01)
  *B82Y 40/00* (2011.01)
  *G03F 7/00* (2006.01)

(56) References Cited

U.S. PATENT DOCUMENTS

| | | | | |
|---|---|---|---|---|
| 6,951,632 | B2 * | 10/2005 | Unger et al. | 422/505 |
| 7,722,752 | B2 * | 5/2010 | Schlenoff et al. | 204/600 |
| 2008/0261006 | A1 * | 10/2008 | McCarty et al. | 428/212 |
| 2010/0233434 | A1 * | 9/2010 | Lahav et al. | 428/156 |

FOREIGN PATENT DOCUMENTS

| | | | |
|---|---|---|---|
| EP | 883025 | A1 * | 12/1998 |
| EP | 0883026 | A | 12/1998 |
| EP | 883026 | A1 * | 12/1998 |
| EP | 1010539 | A | 6/2000 |
| EP | 1010539 | A1 * | 6/2000 |
| GB | 1431462 | A | 4/1976 |
| WO | WO-2008/051432 | A2 * | 5/2008 |

OTHER PUBLICATIONS

Lahav, M., et al., "Pattering of Poly(acrylic acid) by Ionic Exchange Reactions in Microtluidic hannels," Advanced Materials, vol. 18, pp. 3174-3178 (2006).*

International Search Report and Written Opinion dated Mar. 4, 2009 in International Application No. PCT/US2007/022219.

Wang, T., et al., "Polyelectrolyte Multilayer Nanoreactors for Preparing Silver Nanoparticle Composites: Controlling Metal Concentration and Nanoparticle Size," *Langmuir*, vol. 18, pp. 3370-3375 (2002).

Winkleman, A., et al., "Patterning micron-sized features in a cross-linked poly(acrylic acid) film by a wet etching process," *Soft Matter*, vol. 3, pp. 108-116 (2007).

Lahav, M., et al., "Pattering of Poly(acrylic acid) by Ionic Exchange Reactions in Microfluidic Channels," *Advanced Materials*, vol. 18, pp. 3174-3178 (2006).

* cited by examiner

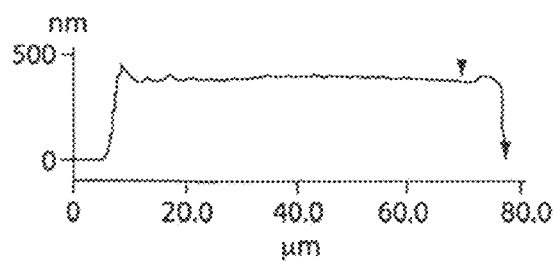
Fig. 5A
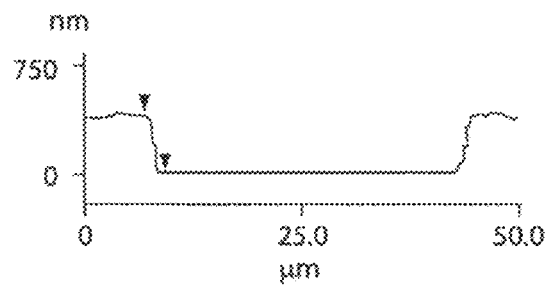
Fig. 5B
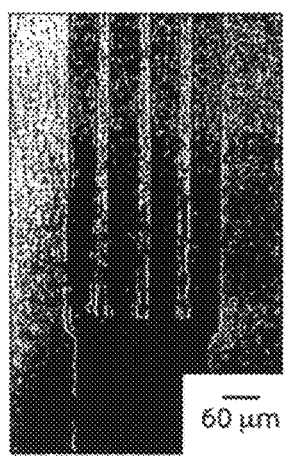 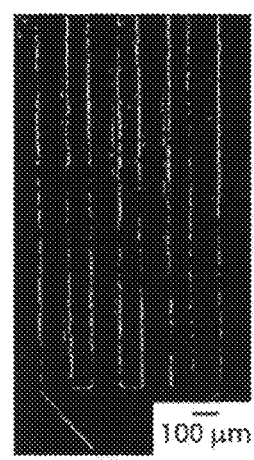
Fig. 5C                    Fig. 5D ↓ BDC (0.1M) + CuSO₄(1M)

PATTERNING OF IONIC POLYMERS

RELATED APPLICATIONS

This application is a U.S. National Application of PCT Application No. PCT/US2007/022219, filed Oct. 18, 2007, which claims priority to U.S. Application Ser. No. 60/853,051, filed Oct. 19, 2006, entitled "Patterning of Polymers, and Other Polymeric Deposition Techniques, Including Ion Exchange" and to U.S. Application Ser. No. 60/853,525, filed Oct. 20, 2006, entitled "Patterning of Polymers, and Other Polymeric Deposition Techniques, Including Ion Exchange", each incorporated herein by reference.

GOVERNMENT SPONSORSHIP

This invention was made with government support under PHY-0117795 and DMR-0213805 awarded by the National Science Foundation and GM065364 awarded by the National Institutes of Health. The government has certain rights in the invention.

FIELD OF INVENTION

The present invention relates generally to methods for patterning polymers, and more specifically, to methods for patterning ionotropic polymers and articles associated therewith.

BACKGROUND

Thin polymer films patterned on glass, semiconductor, and plastic substrates are useful in microelectronics, optics, catalysis, and medical diagnostics. Conventional and more specialized (e.g., topographically-directed and near-field contact mode) photolithography techniques for patterning polymers are limited because they are not compatible with a large number of heat- and light-sensitive polymers and substrates. E-beam writing and laser ablation are capable of patterning a wider range of materials than photolithography, but are inherently non-parallel and slow. Several techniques, such as solvent assisted micro-molding (SAMIM) and micro-molding in capillaries (MIMIC), both based on soft lithography, can pattern a diverse set of organic films and polymers into arbitrary geometries. Nanoimprint lithography, step and flash lithography, and capillary force lithography fabricate features in a polymer substrate defined from a topographically patterned stamp (typically PDMS). Although many techniques for patterning polymers films are available, additional methods that would enable patterning of a wide range of materials on a variety of substrates would find application in a number of different fields.

SUMMARY OF THE INVENTION

The present invention relates generally to methods for patterning polymers, and more specifically, to methods for patterning ionotropic polymers and articles associated therewith.

In one aspect, a series of methods are provided. In one embodiment, a method comprises selectively affecting the crosslinking character of a discrete, predetermined portion of an ionotropic polymer. In another embodiment, a method comprises selectively crosslinking a discrete, predetermined portion of an ionotropic polymer. Such methods may comprise providing an ionotropic polymer defining a surface, positioning a microfluidic device proximate the surface thereby defining at least one channel communicating with a first portion of the surface, exposing the first portion of the surface to a fluid, via the channel, the fluid comprising an ionic species, while blocking a second portion of the surface from the fluid such that the second portion remains essentially free of contact with the fluid, and allowing the fluid to remain in contact with the first portion of the surface for a period of time and under conditions such that ion exchange takes place between the fluid and the polymer thereby affecting the crosslinking character of the discrete, predetermined portion of the ionotropic polymer, including the first portion of the surface. Additionally and/or alternatively, the methods may comprise exposing the discrete, predetermined portion of the ionotropic polymer to a fluid comprising an ionic species which exchanges with an ionic species in the polymer, thereby affecting crosslinking of the polymer. The discrete portion may define a first portion, and the method may comprise allowing a second portion to be essentially free of the crosslinking effect, the method further comprising associating a chemical and/or biological component selectively with the first portion to a greater extent than the second portion. The methods may further comprise determining the chemical and/or biological component. For example, the method may comprise forming nanoparticles from material already present in the polymer, at areas where the polymer is exposed to the crosslinking effect.

In another embodiment a method comprises providing an ionotropic polymer at least partially ionically crosslinked with a first ionic species, exchanging at least some of the first ionic species with a second ionic species such that the polymer is now crosslinked at least to some extent with the second ionic species, and causing at least one of the first or second ionic species to undergo a chemical reaction in association with the polymer.

In another embodiment, a series of articles are provided. The article may comprise at least two discrete lateral regions each comprising nanoparticles having different chemical compositions and separated by a distance of less than 1 millimeter, 500 microns, 250 microns, 100 microns, 50 microns, or 25 microns. In some instances, each of the at least two regions of the article having at least two lateral, perpendicular cross sectional dimensions less than the recited value.

In another embodiment, an article comprises at least two discrete lateral regions each comprising different compositions of ions crosslinking an ionotropic polymer, and having different chemical compositions and separated by a distance of less than 1 millimeter, 500 microns, 250 microns, 100 microns, 50 microns, or 25 microns. Each of the at least two regions of the article may have at least two lateral, perpendicular cross sectional dimensions less than the recited value.

In another embodiment, a method comprises essentially simultaneously removing portions of a first and a second polymer to form a pattern comprising unremoved portions of the first and second polymer, the pattern including features having a cross-sectional dimension of less than 1 millimeter, 500 microns, 250 microns, 100 microns, 50 microns, or 25 microns.

In another embodiment, a method comprises patterning a polymer that is essentially non UV curable at least in part with patterned UV radiation.

In another embodiment, a method comprises essentially simultaneously removing (e.g., developing) portions of PAA and photoresist to form a pattern including unremoved portions of PAA and/or photoresist.

In another embodiment, a method comprises forming an ionotropic polymer in a predetermined pattern, and exchanging ions in the polymer.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 5A-5B are AFM profiles of the cross-section of the PAA features from FIG. 2A showing a PAA plateau (FIG. 5A) and a valley between PAA regions (FIG. 5B) according to one embodiment of the invention;

FIGS. 5C-5D are optical images of a patterned, crosslinked PAA structure according to one embodiment of the invention;

DETAILED DESCRIPTION

Methods for patterning polymers, and more specifically, methods for patterning ionotropic polymers and articles associated therewith are provided.

In one aspect, methods of patterning of thin films of an ionotropic polymer (e.g., poly(acrylic acid)) are provided. These processes can create micron or sub-micron-scale patterns of ionotropic polymers such as cation crosslinked poly(acrylic acid) (CCL-PAA). In one embodiment, patterning may be performed within microfluidic channels by flowing a solution of crosslinking agent (e.g., metal cations such as $Ag^+$, $Ca^{2+}$, $Pd^{2+}$, $Al^{3+}$, $La^{3+}$, and $Ti^{4+}$ that can crosslink a portion of an ionotropic polymer in contact with the solution. In another embodiment, methods of patterning ionotropic polymers involve photolithography. Upon patterning a positive photoresist (e.g., diazonaphthoquinone-novolac resin) on a film of CCL-PAA, the exposed regions of CCL-PAA can be etched by an aqueous solution. Advantageously, the patterned, crosslinked polymer may also serve as both a reactant and a matrix for subsequent chemistry. For instance, in some embodiments, the initial crosslinking cation can be exchanged for a second cation that could not be patterned photolithographically. Patterned films of CCL-PAA can also be used to host and template the reduction of metallic cations to metallic nanoparticles, and to fabricate porous, low-k dielectric substrates. In some cases, these particles can serve as catalysts for electroless deposition of a metal film. For example, nanoparticles can grow in patterned regions defined by the crosslinked PAA in seconds, rather than self-assembling over hours on a pre-formed patterned surface.

It should be understood that while primary description below involves poly(acrylic acid) (PAA), other types ionotropic polymers (i.e., polymers that can be crosslinked by ions) can be used in methods and articles of the invention.

Figure 1:
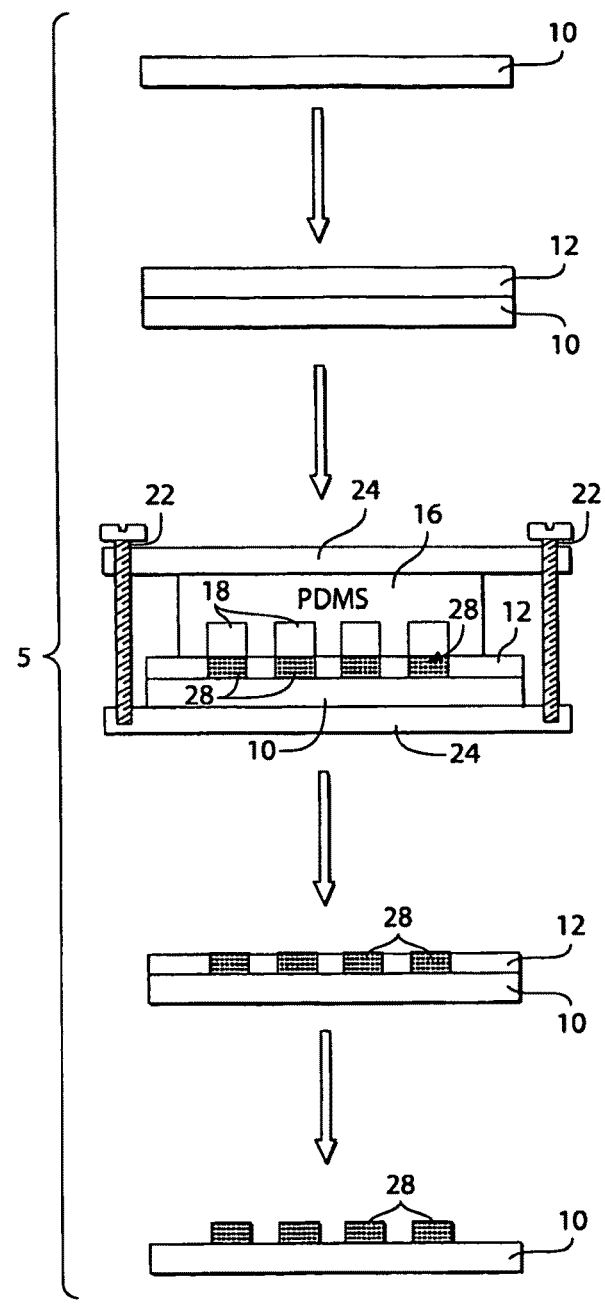
FIG. 1 shows a method of patterning an ionotropic polymer according to one embodiment of the invention.

FIG. 1 shows a method of patterning an ionotropic polymer according to one embodiment of the invention. As illustrated in method 5, ionotropic polymer layer 12 (e.g., poly(acrylic acid) (PAA)) can be positioned on substrate 10 by any suitable method such as spin coating. In some cases, layer 12 can be heated. Article 16 including microfluidic channels 18 can be positioned on layer 12. As shown in the illustrative embodiment, article 16 may be secured onto layer 12 by the use of one or more fasteners 22 and plates 24. In other embodiments, however, a fastener may not be needed. A solution containing a crosslinker (e.g., metal cations) can be flowed through channels 18 and these crosslinkers can cause crosslinking of portions 28 of layer 12 in contact with the solution. In some cases, this crosslinking of ionotropic polymer layer 12 can cause reduction of the solubility of portions 28 in water. After removing article 16 and rinsing the substrate with a fluid such as methanol, water can be used to dissolve the uncrosslinked regions of layer 12. This process can generate a topologically-patterned surface comprising portions 28 which may define features of a ionotropic polymer having lateral dimensions ranging from microns to nanometers.

In some embodiments, portions 28 can be crosslinked with two or more different crosslinking agents. For example, in the case of layer 12 being a poly(acrylic acid) layer, palladium or zinc ions can be used as crosslinkers. In one embodiment, a single portion 28 can be crosslinked with more than one crosslinking agent, e.g., by flowing a solution containing both crosslinking agents in a microfluidic channel 18. In another embodiment, a first crosslinking agent can be flowed in a first microfluidic channel and a second crosslinking agent different from the first crosslinking agent can be flowed in the second microfluidic channel. Thus, ionotropic polymer with portions 28 can have different chemical properties and can undergo different subsequent chemical reactions.

In some cases, portions 28 can be further treated to cause a change in a chemical and/or physical property of the portion. For example, in one embodiment, reductants (e.g., borane dimethylamine complex, BDC) and/or other reagents (e.g., $Na_2S$) can convert appropriate crosslinking cations (e.g, Pd(II) or Zn(II)) to metallic or semiconducting nanoparticles, respectively, throughout the matrix of ionotropic portions 28. This method can allow cation conversion using a single article including one or more microfluidic channels to permit several types of nanoparticles (e.g., Au and Pd) to be patterned simultaneously on the same "chip". It should be understood that simple reactions involving crosslinking agents such as metal cations are known in the art and that the invention is not limited in this respect.

Nanoparticles patterned on the sub-micron scale can be useful as nucleation sites for the growth of patterned nanostructures. Methods described herein for crosslinking a polymer within a microfluidic channel (or crosslinking by any other suitable method) enables, for example, further reactions to be done using a combinatorial strategy. For instance, in one embodiment, a set of crosslinking solutions of different crosslinkers (e.g., different multivalent metal cations) can be simultaneously introduced into the channels, and thereby form a pattern of lines (or any desired shape), each with a different functionality. In one particular embodiment, solutions of different crosslinking agents can be flowed in a single channel by laminar flow and adjacent portions of an ionotropic polymer can be patterned simultaneously with the different crosslinking agents. The patterned portions of the polymer can then undergo subsequent chemical and/or biological reactions.

In some embodiments, methods described herein involve providing an ionotropic polymer at least partially ionically crosslinked with a first ionic species (e.g., $Ca^{2+}$), and exchanging at least some of the first ionic species with a second ionic species (e.g., $Pd^{2+}$) such that the polymer is now crosslinked at least to some extent with the second ionic species. The method may also include causing at least one of the first or second ionic species to undergo a chemical reaction in association with the polymer. For example, if the first or second ionic species is $Pd^{2+}$, the chemical reaction may involve reduction of $Pd^{2+}$ to $Pd^0$. Other chemical reactions can also be performed. In some instances, the method involves simultaneously performing a chemical reaction associated with the polymer and exchanging a first ionic species (e.g., crosslinking agent) in the matrix of the polymer with a second ionic species (e.g., crosslinking agent).

In some embodiments, methods described herein can cause the formation of at least first and second ionotropic polymer portions (e.g., features such as a protrusion and/or recess), and a chemical and/or biological component may be selectively associated with the first portion to a greater extent than the second portion. In some instances, the first and second portions are isolated from one another, e.g., the first portion may be a first isolated feature and the second portion may be a second isolated feature, the first and second portions separated by a non-ionotropic polymer portion. The first and second portions may, but need be, positioned on a common substrate. The chemical and/or biological component may include, for example, cells, viruses, nanoparticles, beads, proteins, nucleic acids (e.g., DNA, RNA), semiconductive materials, colloids, chemical species (e.g., ligands, therapeutic agents, extracellular matrix materials), polymers, and the like. In one embodiment, the chemical and/or biological component is associated (e.g., entrapped) within the matrix of the first and/or second polymer portions. In another embodiment, the chemical and/or biological component is adsorbed onto a surface of the first and/or second polymer portions. For example, in some cases, patterned ionotropic polymer articles described herein may be used as substrates for cell growth. In yet another embodiment, the chemical and/or biological component is crosslinked with at least a portion of a polymer component. The chemical and/or biological component may be determined (e.g., measured, counted, detected, etc.) after associating with a polymer portion.

Figure 2A:
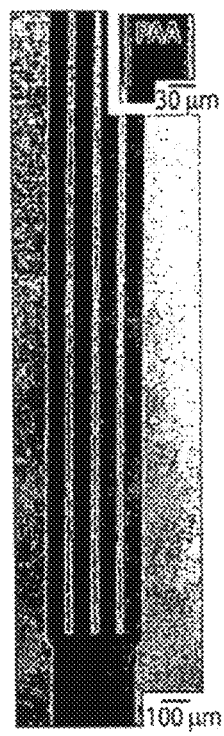
FIGS. 2A-2C show optical images of various patterns of crosslinked poly(acrylic acid) (PAA) according to one embodiment of the invention.
Figure 2B:
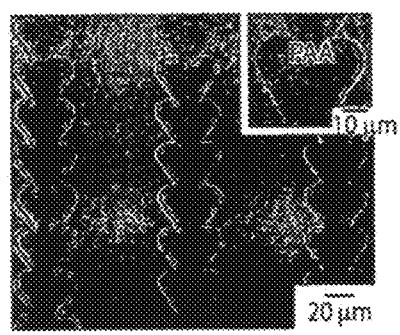
Figure 2C:
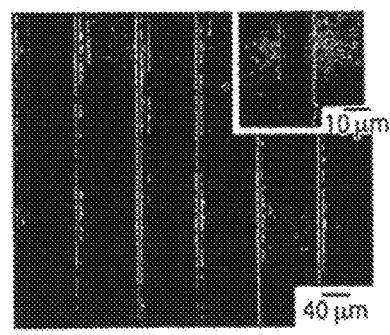
Figure 2D:
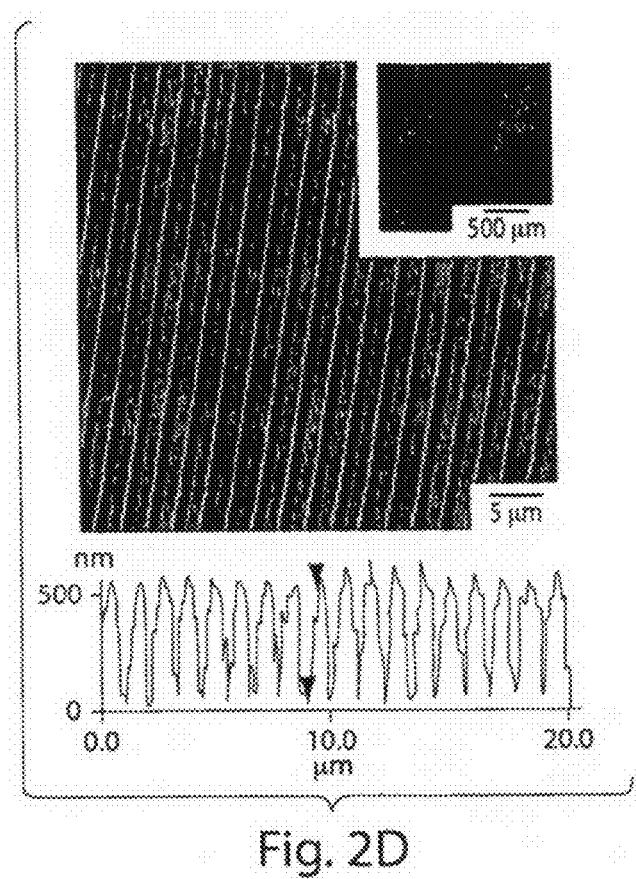
FIG. 2D shows an AFM image of lines of cation crosslinked poly(acrylic acid) (CCL-PAA) according to one embodiment of the invention.

FIGS. 2A-2C show optical images of a patterned PAA structure crosslinked by exposure to 1M $La(NO_3)_3 \cdot 6H_2O$ in methanol/water (v/v; 70/30) for 5 minutes. The uncrosslinked PAA was then dissolved and removed with water. FIG. 2A show crosslinked PAA lines, 60 µm wide spaced by ~30 µm, are over 2.5 cm in length. The inset shows a higher magnification of a patterned region, which illustrates that the edge resolution is similar to that of soft lithography using a transparency photomask. FIG. 2B shows "heart-shaped" channels. FIG. 2C shows a set of straight channels: the channel width and spacing are 13 µm and 80 µm, respectively. FIG. 2D shows an AFM image of ~500 nm lines of CCL-PAA/Ba(II) spaced by ~500 nm representing the lower limit we have demonstrated for the resolution of this technique (top), and profile of the cross-section of the patterned surface over a length of 20 µm (bottom).

Figure 3A:
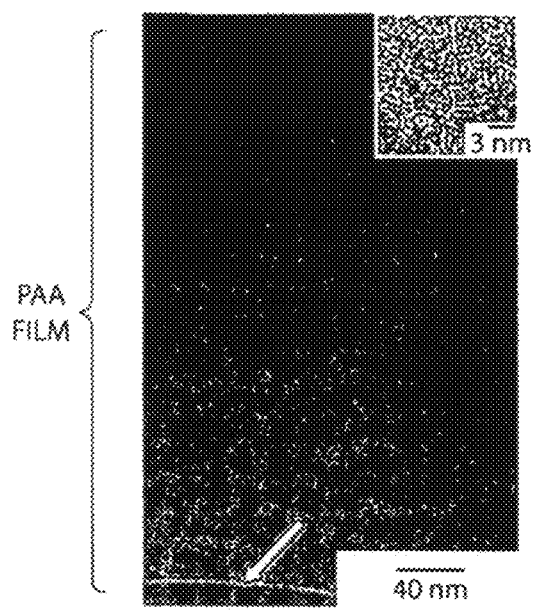
FIG. 3A is a TEM image showing a cross-section of a CCL-PAA/Ca(II) film containing Pd(0) nanoparticles embedded in an epoxy support matrix according to one embodiment of the invention.
Figure 3B:
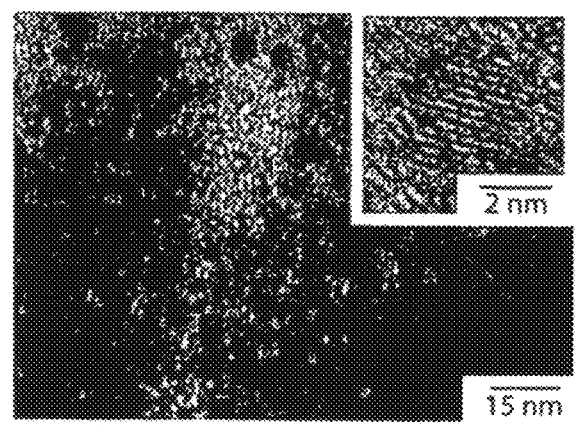
FIG. 3B is a TEM image showing a top-view of a CCL-PAA/Ca(II) film containing nanoparticles PbS according to one embodiment of the invention.

FIG. 3A is a TEM image showing a cross-section, obtained by microtoming an ~80 nm-thick slice from a CCL-PAA/Ca (II) film containing Pd(0) nanoparticles embedded on an epoxy support matrix, after the reduction of Pd(II) by BDC in the presence of $CaCl_2$. Colloids of palladium are observed across the entire polymer matrix, as particles are present along the bottom edge of the PAA film (the edge originally on the silicon wafer and indicated by a white arrow) all the way to the top of the PAA film (~350 nm high). The inset of FIG. 3A is a higher magnification image of the film showing that the colloids are ~4 nm in diameter. FIG. 3B is TEM image showing a top-view of a CCL-PAA/Ca(II) film containing PbS nanoparticles. The inset of FIG. 3B is a higher magnification of the film showing one particle with a diameter of ~3 nm.

Figure 4A:
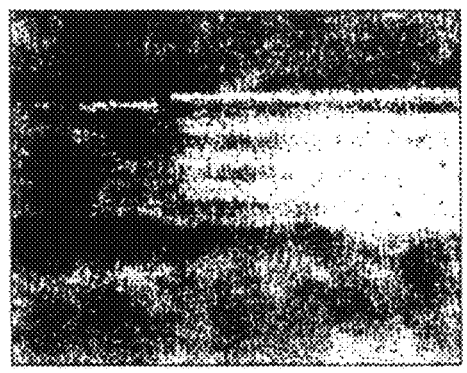
FIGS. 4A-4C are optical images of patterned lines of CCL-PAA/Pd(II) during its reduction at 0 seconds (FIG. 4A) 5 seconds (FIG. 4B) and 20 seconds (FIG. 4C) according to one embodiment of the invention.
Figure 4B:
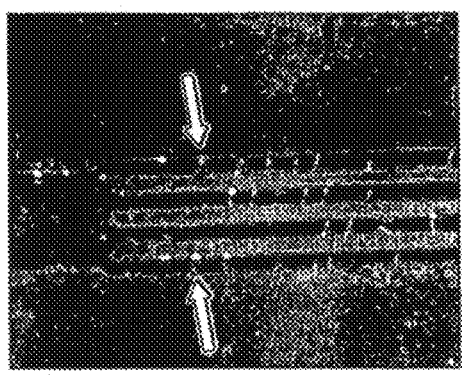
Figure 4C:
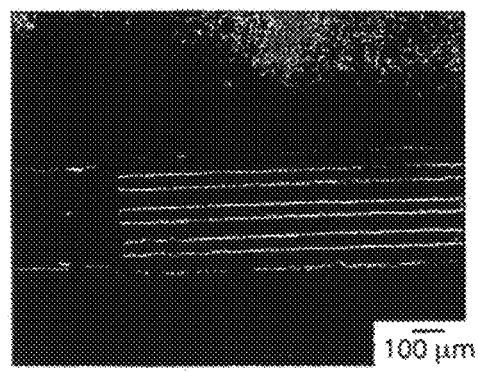

FIGS. 4A-4C are optical images of patterned lines of CCL-PAA/Pd(II) during its reduction by an aqueous solution of BDC (0.1M) and $CuSO_4$ (1M) in a PDMS channel, at times 0 seconds (FIG. 4A), 5 seconds (FIG. 4B), and 20 seconds (FIG. 4C). FIG. 4B shows gas bubbles evolved as the Cu(II) was reduced to Cu(0) by the BDC; this reduction was catalyzed by the Pd(0) nanoparticles. FIG. 4C shows that upon completion of the reduction, the PAA film was no longer transparent and gas evolution ceased.

FIGS. 5A-5B are AFM profiles of a cross-section of the PAA features shown in FIG. 2A illustrating a PAA plateau (FIG. 5A) and a valley between PAA regions (FIG. 5B). In both cases, the step height was ~355 nm. FIGS. 5C-5D are optical images of a patterned PAA structure crosslinked by 1M $Ho(NO_3)_3 \cdot 5H_2O$ in methanol/water (v/v, 70/30) solution (FIG. 5C) and 1M $ZnAc_2$ in $H_2O$ (FIG. 5D). The channel dimensions are 60 μm wide spaced by 30 μm (FIG. 5C) and 100 μm wide spaced by 100 μm (FIG. 5D).

Figure 6A:
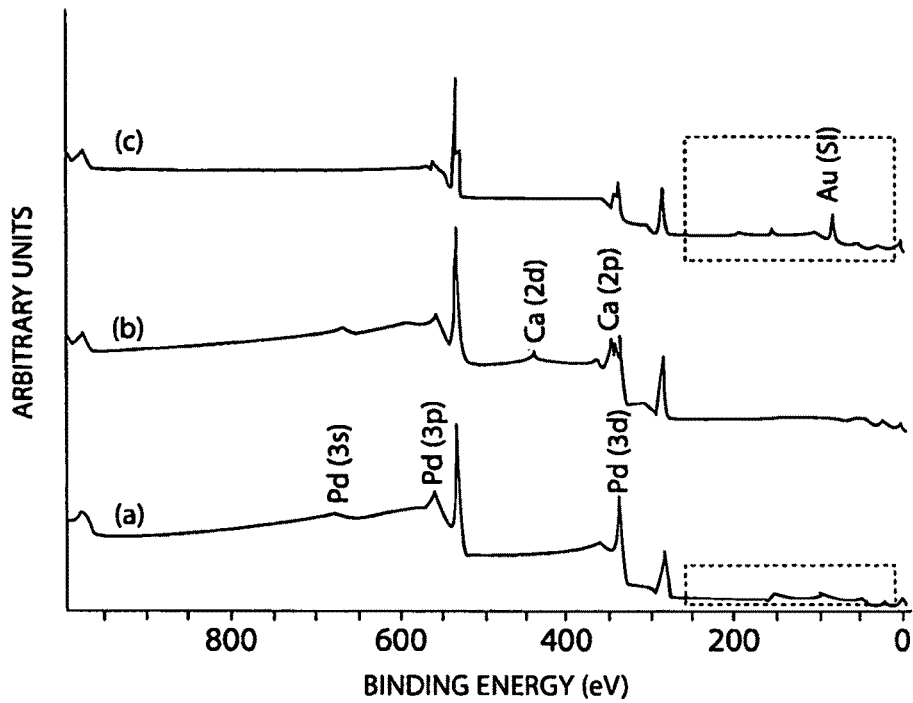
FIGS. 6A-6B show XPS data for the surface of several PAA films according to one embodiment of the invention.
Figure 6B:
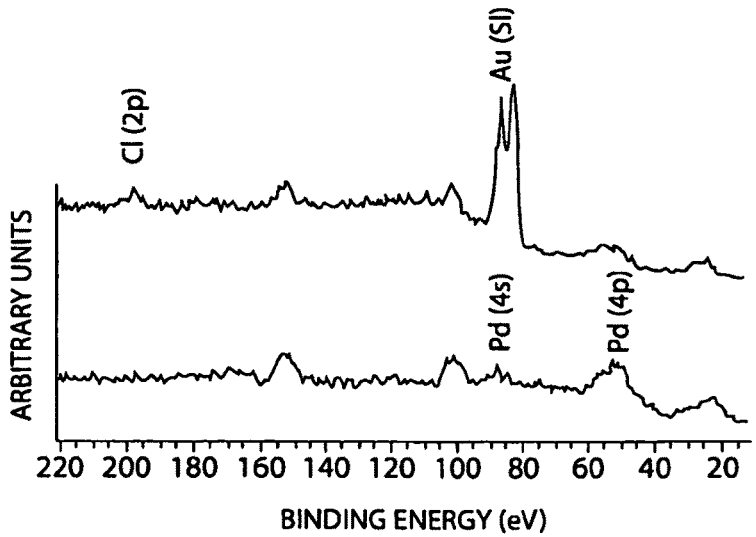

FIG. 6A shows XPS data for the surface of PAA films (a) crosslinked with $PdSO_4$ in methanol/water, (b) exposed to a solution of BDC to reduce the CCL-PAA/Pd(II) film in the presence of $CaCl_2$ (1M) for 2 minutes, and (c) subsequently treated with 0.5 M $NaAuCl_4$(aq) for 30 min. FIG. 6B shows expansion of the marked region in FIG. 6A. Peaks at all the characteristic orbital energies of palladium were observed in addition to those of oxygen and carbon from PAA. The XPS data were referenced to the carbon peak at 284 eV. After reduction of gold, intense peaks corresponding to Au 5f orbitals appeared, and the intensity of the Pd peaks decreased. A small amount of Cl was observed on the surface, most likely a result of the $NaAuCl_4$ salt.

Figure 7:
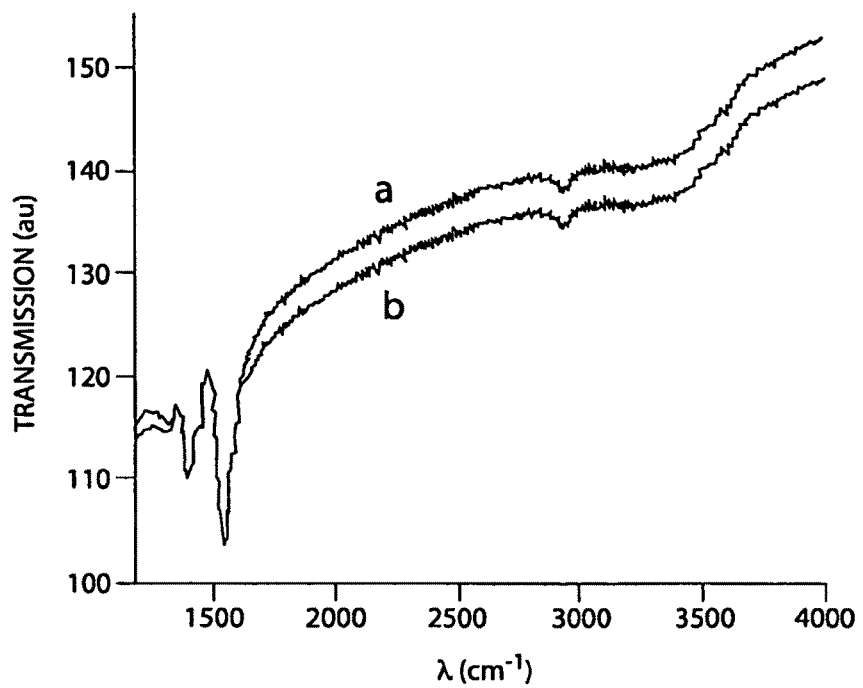
FIG. 7 shows FT-IR spectra of a crosslinked PAA film before and after exposure of the film to a reducing solution according to one embodiment of the invention.

FIG. 7 shows FT-IR spectra of a crosslinked PAA film by La(III) (a) before and (b) after exposure of the film to a reducing solution containing BDC. The location and intensity of the peak from the carbonyl functional group at ~1550 $cm^{-1}$ did not change between the two spectra.

Figure 8A:
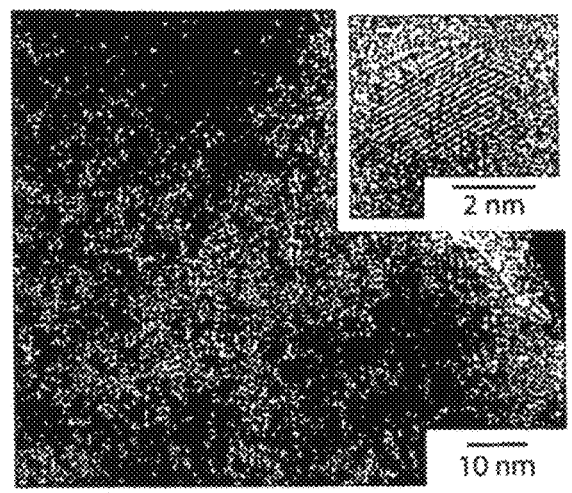
FIG. 8A shows a top view of a CCL-PAA/Ca(II) film containing ZnS nanoparticles according to one embodiment of the invention.
Figure 8B:
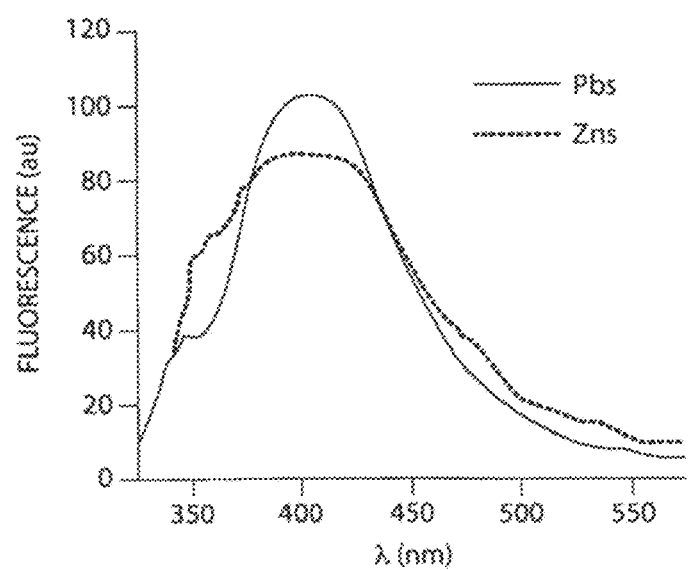
FIG. 8B shows fluorescence spectra from semiconductor particles in solution after dissolution of a PAA film according to one embodiment of the invention.

FIG. 8A shows a top-view of a CCL-PAA/Ca(II) film containing ZnS nanoparticles. The inset is a higher magnification of the film showing one particle with a diameter of ~3 nm. FIG. 8B shows fluorescence spectra from the semiconductor particles ZnS and PbS in solution after dissolution of a PAA film with a solution of 1 M NaOH.

Figure 9A:
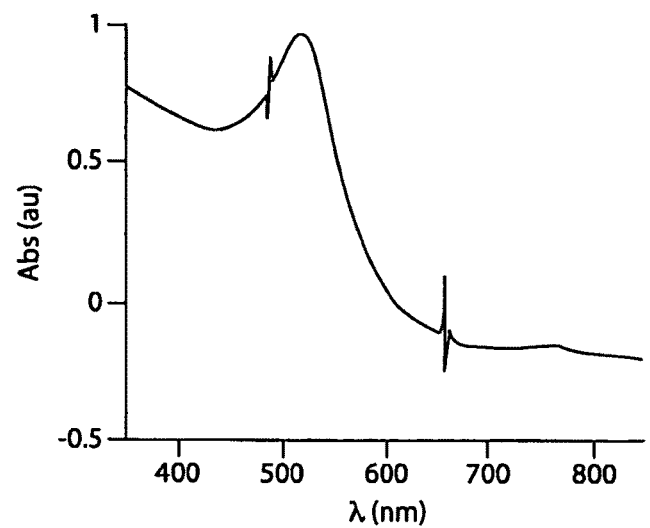
FIGS. 9A-9B show UV-Vis absorption spectra of crosslinked PAA films comprising gold nanoparticles embedded within the polymer according to one embodiment of the invention.
Figure 9B:
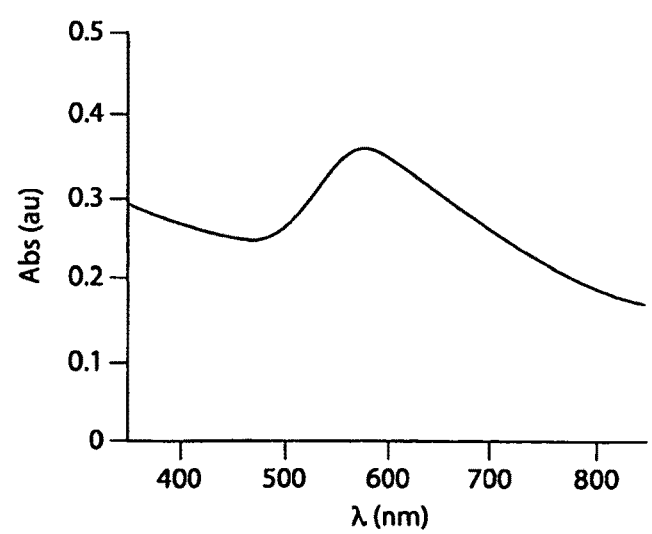

FIGS. 9A-9B show UV-Vis absorption spectra of crosslinked PAA films comprising gold nanoparticles embedded within the polymer. FIG. 9A shows a spectrum of a PAA film crosslinked with $PdSO_4$ in methanol/water for 20 minutes and subsequently exposed to an aqueous solution of 0.5 M $NaAuCl_4$ for 30 min. The absorbance of the Au particles had kmax ~520 nm; this peak is a characteristic absorbance for gold nanoparticles with a diameter ~15 nm. FIG. 9B shows a spectrum of a CCL-PAA/Pd(II) crosslinked PAA film prepared in methanol, reduced with BDC in the presence of $CaCl_2$ (1M) for 2 min, and subsequently exposed to an aqueous solution of 0.5M $NaAuCl_4$ for 30 min. The absorbance of the Au particles was red-shifted (kmax ~580 nm) and broadened with respect to the peak in FIG. 9A.

Figure 10A:
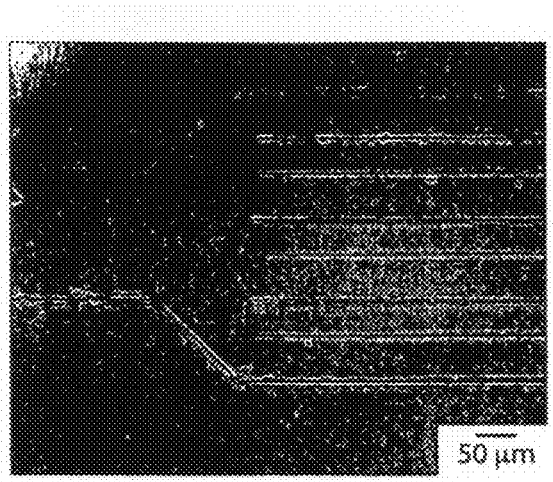
FIGS. 10A-10B show optical images of PAA lines on a glass substrate after crosslinking with various crosslinking agents according to one embodiment of the invention.
Figure 10B:
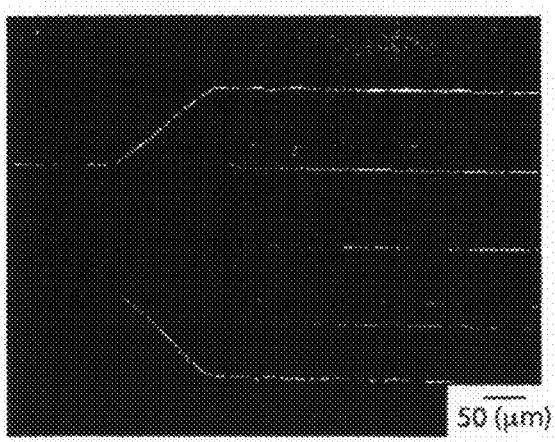

FIGS. 10A-10B show optical images of PAA lines on a glass substrate after crosslinking with various crosslinking agents. FIG. 10A shows crosslinking with saturated $PdSO_4$ solution in methanol/water. FIG. 10B shows subsequently reducing the Pd(II) with an aqueous solution containing 0.1 M BDC and 1 M $CuSO_4$. If the reduction continued for more than 5 minutes, the patterned structure detached from the substrate.

As described herein, one aspect of the invention involves selectively affecting the crosslinking character of a discrete, predetermined portion of an ionotropic polymer. For the example, a discrete, predetermined portion of an ionotropic polymer may be selectively crosslinked (e.g., such that one portion of the polymer is crosslinked, and an adjacent, second portion of the polymer remains uncrosslinked). In some instances, methods of affecting crosslinking character involve providing an ionotropic polymer defining a surface and positioning a microfluidic device proximate the surface thereby defining at least one channel communicating with a first portion of the surface. The first portion of the surface may be exposed to a fluid, via the channel, the fluid comprising an ionic species, while blocking a second portion of the surface from the fluid such that the second portion remains essentially free of contact with the fluid. The fluid may remain in contact with the first portion of the surface for a period of time and under conditions such that ion exchange takes place between the fluid and the polymer thereby affecting the crosslinking character of the discrete, predetermined portion of the ionotropic polymer, including the first portion of the surface.

It should be understood that other methods of introducing ionic species to selectively crosslink portions of an ionotropic polymer are also possible. For example, in one embodiment, microcontact printing (e.g., stamping using an elastomeric stamp), which is a method known to those of ordinary skill in the art, can be used. In some such embodiments, the ionic species may be, for example, in the form of a film on a surface of a stamp or as part of a fluid within the matrix of the stamp prior to contact with an ionotropic polymer. Upon contact, the ionic species can be transferred to selective portions of the ionotropic polymer to effect crosslinking.

In methods described herein, a discrete, predetermined portion of an ionotropic polymer may be exposed to a fluid comprising an ionic species which exchanges with an ionic species in the polymer, thereby affecting crosslinking of the polymer. In some cases, the discrete portion defines a first portion and a second portion may be allowed to be essentially free of the crosslinking effect. A chemical and/or biological component may be selectively associated with the first portion to a greater extent than the second portion, and the chemical and/or biological component may be determined. For example, such a process may include forming nanoparticles from material (e.g., a crosslinking agent) already present in the polymer, at areas where the polymer is exposed to the crosslinking effect.

As noted above, described herein is a simple photolithographic method to create sub-micron-scale patterns of cation-crosslinked poly(acrylic acid) (CCL-PAA) in which the crosslinking cations can be exchanged for other cations. These films can be processed to generate patterned metallic nanoparticles and low-k dielectric materials. In one embodiment, a patterned layer of positive photoresist (diazonaphthoquinone-novolac resin) blocked selectively the aqueous etching of only the unexposed regions of an underlying layer of CCL-PAA; acetone dissolved the masking photoresist without affecting the CCL-PAA. After patterning the CCL-PAA film, the metal cation originally used for crosslinking can be exchanged with another cation—either a different metal cation (e.g., $Pd^{2+}$) or a cationic organic molecule (e.g., 3,6-diaminoacridine hydrochloride (DAH))—by soaking the film in a concentrated solution of the second cation. Reduction of a CCL-PAA film containing $Pd^{2+}$ or $Ag^+$ yielded patterns of metallic nanoparticles embedded within the film. Calcination or ozonation of an $Al^{3+}$-crosslinked PAA film can generate a patterned, porous oxide film with the characteristics of a low-k dielectric. The CCL-PAA matrix, in which different metal cations were incorporated, may offer a new platform for positioning and fabricating nanomaterials with sub-micron spatial control. The use of photolithographic techniques may facilitate the incorporation of these new materials into existing technologies including those for microelectronics.

The ability to pattern thin polymer films on substrates is central to microelectronics, optics, MEMS, and biochemistry. There are several ways to pattern polymers, including e-beam writing and laser ablation, (which are non-parallel and inherently slow), and various techniques based on soft lithography. Photolithography, to this point, could only pattern polymer photoresists, but photoresists, unlike PAA, generally cannot serve as matrices for further organic reactions (because they dissolve in organic solvents) or as matrices for metal ions.

Thin-film, low-k dielectric substrates are polymers or inorganic oxides having dielectric constants (k) lower than bulk silicon dioxide (k ~4). Capacitance depends on the dielectric constant, so low-k dielectric materials are desirable because they reduce the capacitance between wires and allow increased operating frequencies in microelectronic devices. There is great interest in generating porous dielectrics because of their reduced effective dielectric constant as compared to bulk materials. A common technique for fabricating low-k materials is spinning a solution or suspension (a sol) of the dielectric, followed either by solvent evaporation (e.g., xerogels), or by supercritical drying of the gel (e.g., aerogels). Chemical vapor deposition (CVD) can also used to generate thin silica oxides with high porosity. The materials produced by both methods are often mechanically very fragile, and post-processing steps—including patterning of the low-k dielectric films—are technically difficult. The procedures presented here allow for patterning of the CCL-PAA prior to converting it to a low-k dielectric film by calcination or ozonation of the organic matrix.

A variety of crosslinking agents such as metal cations, including, but not-limited to, alkaline earth metals, transition metals, and lanthanides, can be used to crosslink a ionotropic polymer such as PAA. Table 1 lists some of these cations by atomic number. Without wishing to be bound by theory, the inventors hypothesize that in order for a metal cation to crosslink a PAA film, at least two of the ligands in the inner coordination sphere of the metal cation can be replaced by carboxylate groups from PAA.

TABLE 1

Metal salts that crosslink a film of PAA $Al_2(NO)_3$
$CaCl_2$
$TiBr_4$
$TiI_4$
$MnCl_2$
$Fe(NO_3)_3$
$FeCl_2$
$NiSO_4$
$NiCl_2$
$Cu(OAc)_2$ TABLE 1-continued Metal salts that crosslink a film of PAA $ZnCl_2$
$Zn(OAc)_2$
$ZrCl_4$
$ZrO(NO_3)_2$
$Pd(SO_4)$
$AgNO_3$
$BaS$
$BaCl_2$
$La(NO_3)_3$
$GdCl_3$
$Ho(NO_3)_3$
$Pb(OAc)_2$
$UO_2(OAc)_2$ In another aspect of the invention, ionotropic polymers (which, in some cases, are not photosensitive) can be patterned using a process involving photolithography. As shown in the embodiment illustrated in FIG. 11, method 100 includes a combined photolithography and wet-etching process. In some embodiments, after spin-casting and baking an adhesion layer of an ionotropic polymer layer 110 (e.g., PAA, pH=2.5) onto a substrate 110, a second layer of an ionotropic polymer (e.g., PAA, pH 7.2) can be spun-casted. Other methods of depositing polymer layers onto substrates are known to those of ordinary skill in the art can be used. The polymer layers can be crosslinked with a solution of crosslinking agent (e.g., an aqueous 1 M salt solution of, e.g., $CaCl_2$, (pH 6.8) or $Al_2(SO_4)_3$ (pH ~6.5)). This causes layer 112 to be crosslink into crosslinked layer 114. Photoresist 116 (e.g., a positive photoresist such as a diazonaphthoquinone-novolac resin) can be spun onto layer 114 and exposed to UV irradiation through photomask 120. In some cases, the exposed photoresist portions 124, and portions 126 of layer 114 underneath photoresist portions 124, can be removed simultaneously by etching with a suitable solvent (e.g., 0.7 M solution of NaOH), leaving unexposed portions remaining on the surface. It should be understood that in other embodiments, using a combination of either positive or negative photoresist and placement of the photomask, exposed or unexposed portions or the photoresist, as well as crosslinked (or uncrosslinked) ionotropic polymer can be removed by a suitable solvent. For example, for some cations (e.g., $Al^{3+}$ or $Ca^{2+}$) used as crosslinking agents, the alkaline etchant can dissolve both the exposed photoresist and the ionotropic polymer (e.g., CCL-PAA) directly beneath it. If the etchant cannot uncrosslink and dissolve the ionotropic polymer (but can dissolve the exposed (or unexposed) photoresist portions), in some cases a second etchant (e.g., aqueous solution containing 0.5 M EDTA) can be used to remove the ionotropic polymer portions. The unexposed photoresist portions 128 can then removed with a suitable solvent (e.g., acetone). This process can yield ionotropic polymer portions 130 (e.g., which may form a patterned ionotropic polymer structure) on the substrate (e.g., to form isolated or continuous features of ionotropic polymer).

In some embodiments, methods described herein can essentially simultaneously remove portions of a first and a second polymer (e.g., a photosensitive polymer and an ionotropic polymer) to form a pattern comprising unremoved portions of the first and second polymer, the pattern including features having a cross-sectional dimension of, for example, less than 1 millimeter, 500 microns, 250 microns, 100 microns, 50 microns, or microns. In some cases, portions of PAA (or another polymer that is not photosensitive) and photoresist (or another photosensitive polymer) are essentially simultaneously removed (e.g., developed) to form a pattern including unremoved portions of PAA and/or photoresist. The pattern may include features having a cross-sectional dimension of, for example, less than 1 millimeter, 500 microns, 250 microns, 100 microns, 50 microns, or 25 microns.

Methods describe herein can also be used to form an article comprising at least two discrete lateral regions each comprising different compositions of ions crosslinking an ionotropic polymer, and having different chemical compositions and separated by a distance of, for example, less than 1 millimeter, 500 microns, 250 microns, 100 microns, 50 microns, or 25 microns. In some cases, each of the at least two regions have at least two lateral, perpendicular cross sectional dimensions less than the recited value. In another embodiment, an article can comprise at least two discrete lateral regions each comprising nanoparticles having different chemical compositions and separated by a distance of less than 1 millimeter, 500 microns, 250 microns, 100 microns, 50 microns, or 25 microns. In some cases, each of the at least two regions have at least two lateral, perpendicular cross sectional dimensions less than the recited value.

In another embodiment, a polymer that is essentially non-UV curable (e.g., not photosensitive) is patterned at least in part with patterned UV radiation. This can be done, for example, using the method described in FIG. 11.

As described herein, using methods described herein, PAA or other ionotropic polymer films can be crosslinked with metal cations in the form of a pattern. The patterned crosslinked film can act as an ion-exchange resin that allows one cation to be exchanged for another. In other words, an ionotropic polymer can be formed in a predetermined pattern, and then ions in the polymer can be exchanged while maintaining fidelity of the features of the pattern. Also, reduction of these metal cations can generate nanoparticles within a patterned polymer matrix. Calcination or ozonation of a metal-containing film can create porous thin films of metal oxide that function as low-k dielectric materials.

Figure 11:
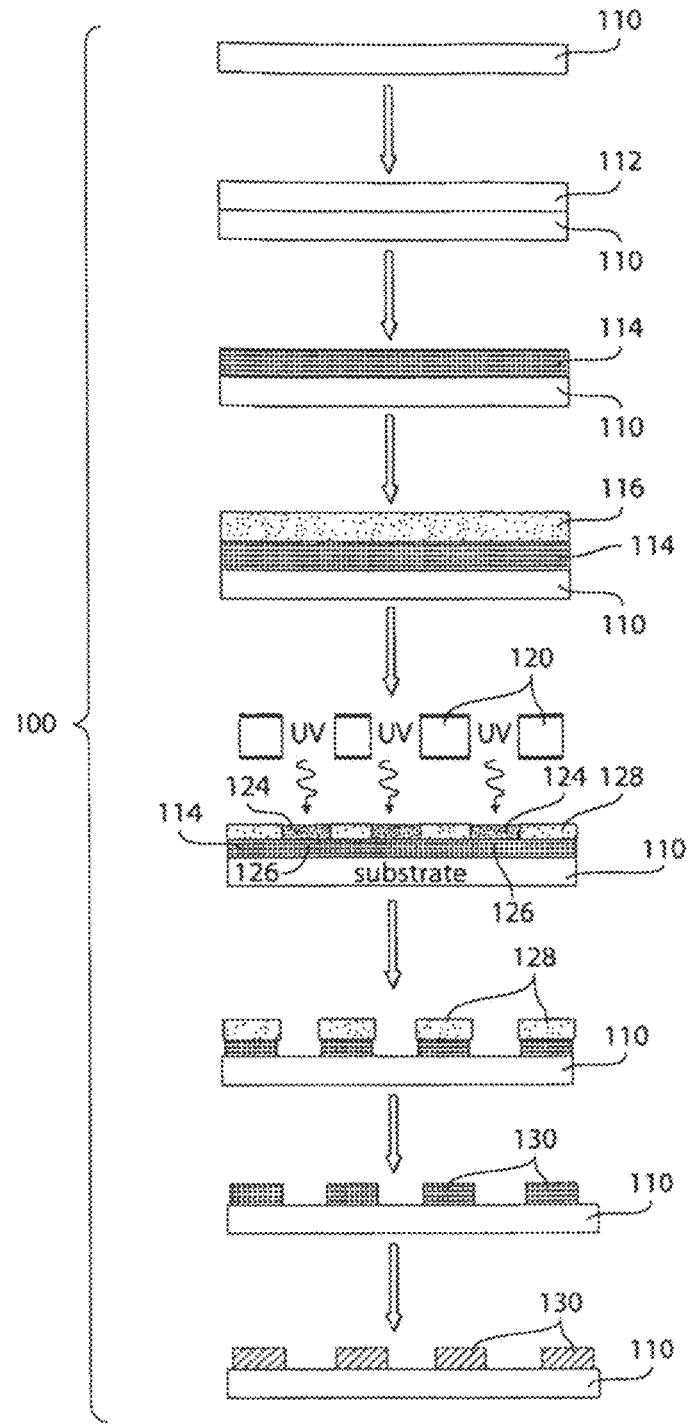
FIG. 11 shows a method of patterning ionotropic polymers in a process involving photolithography according to one embodiment of the invention.

In comparison to some other methods for patterning thin polymer films, the advantages of using the technique described in. FIG. 11 to pattern a CCL-PAA film (or other ionotropic polymer film) include the ability i) to use standard photolithographic processes to yield CCL-PAA structures, ii) to pattern a wide array of both continuous and discontinuous patterns in CCL-PAA, iii) to incorporate a wide range of crosslinking agents, and iv) to exchange the cations reversibly in the matrix without degradation of the pattern.

In some embodiments, a metal-containing ion-exchange resin patterned with high edge resolution can generate patterned catalytic surfaces, tailor surface chemistry for "lab-on-a-chip" devices, or yield fluorescent or optically-active surfaces containing semiconducting or metallic nanostructures. The use of standard photolithographic processes and materials enables this technology to be incorporated easily into current fabrication processing, and expands the types of materials available for microelectronics.

In some embodiments, patterning may be defined at least in part only by a photomask and photolithography. As such, a wide range of features, both continuous and discontinuous, are possible, e.g., as shown in FIG. 12. FIG. 12 shows a series of optical and AFM images illustrating the resolution and range of the geometric patterns that were fabricated using the method shown in FIG. 11. Films were prepared with $Al^{3+}$ and $Ca^{2+}$ as the crosslinking cations. FIGS. 12B, 12D-12H show films that were crosslinked with $Al^{3+}$ cations and FIGS. 12A and 12C were crosslinked with $Ca^{2+}$.

Figure 12A:
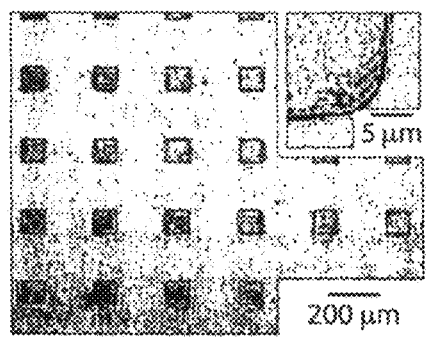
FIGS. 12A-12H show various arraignments of patterned ionotropic polymers according to one embodiment of the invention.
Figure 12B:
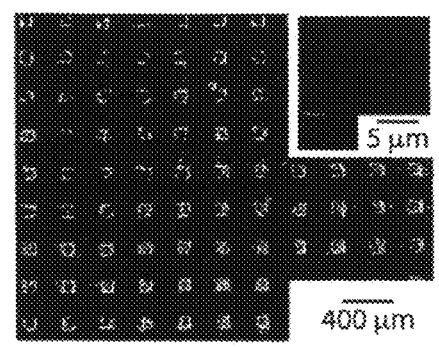
Figure 12C:
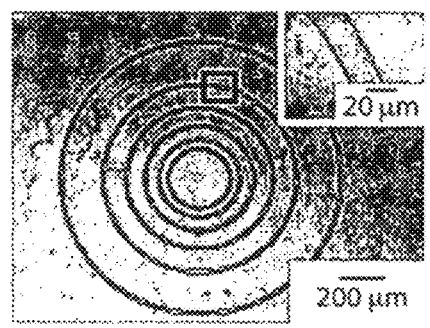
Figure 12D:
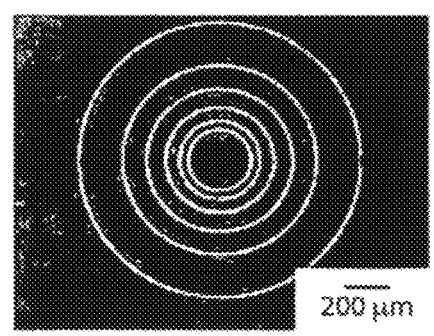
Figure 12E:
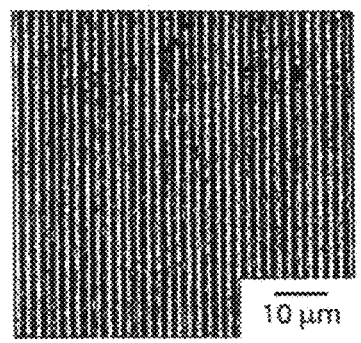
Figure 12F:
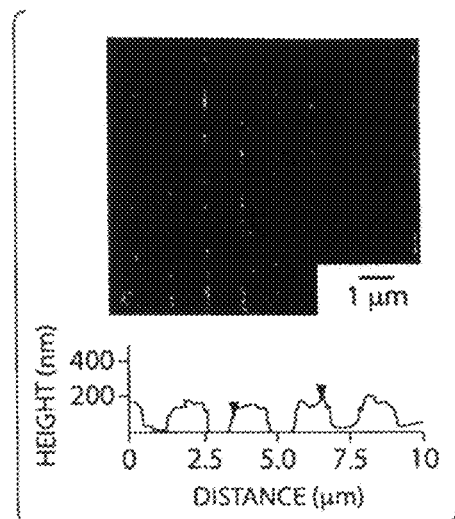

Arrays comprising a discontinuous pattern of CCL-PAA square posts (FIG. 12A) as well as square wells in a continuous CCL-PAA film (FIG. 12B) were fabricated, all with sides having length 100 μm. Posts and wells in other geometries such as triangles, circles, and pentagons with similar feature sizes were also fabricated. Concentric rings of CCL-PAA with constant width (20 microns) and increasing spacing between the lines are shown in FIG. 12C. The insets in FIGS. 12A-12C show a magnified region illustrating the well-defined edges. FIG. 12D shows increasing line-width and a constant spacing between the lines by using the inverse photomask. The edge roughness for all of these structures fabricated from photoplotted photomasks was ~1 μm (which is shown in more detail below in FIG. 16). FIGS. 12E and 12F shown an optical image and an AFM image, respectively, of a series of 1-μm lines spaced by 1 μm.

Figure 12G:
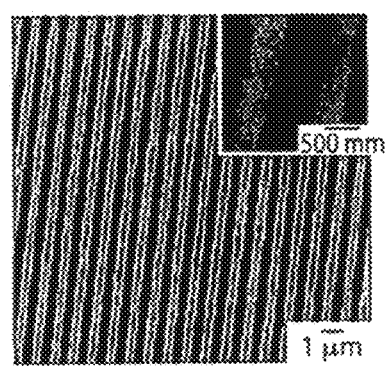
Figure 12G:
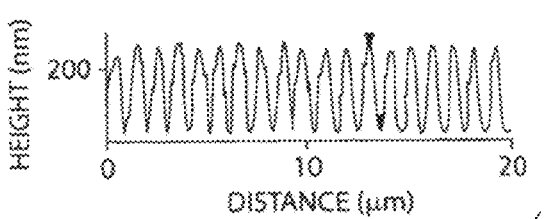
Figure 12H:
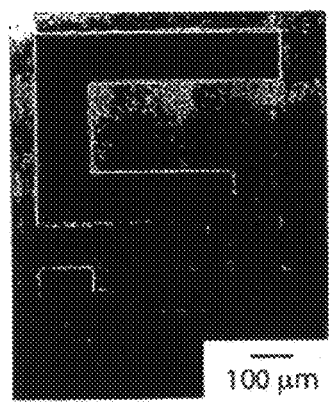

FIG. 12G shows ~500 nm line width and line spacing that was achieved with this technique using a chrome mask. To prevent over-etching of the 500 nm CCL-PAA/$Al^{3+}$ features, the developer was diluted to a 0.47 M NaOH solution and etched for 3 seconds. The edge roughness of these features patterned from chrome masks was <70 nm; a size on the order of the resolution of the mask (FIG. 16).

In some embodiments, ionotropic polymer films that were crosslinked in the presence of an additional, non-interacting molecule allowed retention of these molecules during the etching process. For example, a CCL-PAA/$Al^{3+}$ film containing a dye (either fluorescein or rhodamine B) fluoresced after patterning. As shown in the embodiment illustrated in FIG. 12H, the fluorescence was only observed in the regions where the polymer film remained. No fluorescence was observed in CCL-PAA/$Al^{3+}$ films in the absence of a dye.

Figure 13A:
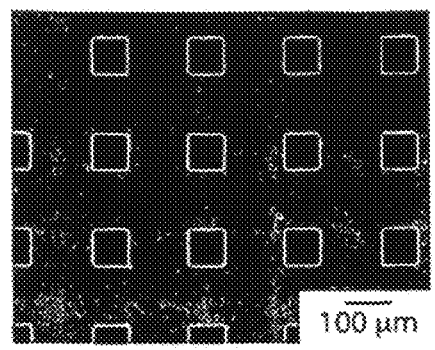
FIGS. 13A-13C show patterned ionotropic polymers after exchanging an original crosslinking cation for another cation according to one embodiment of the invention.
Figure 13B:
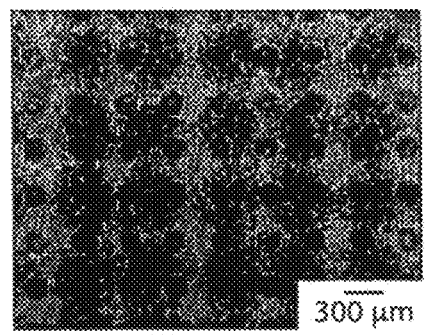
Figure 13C:
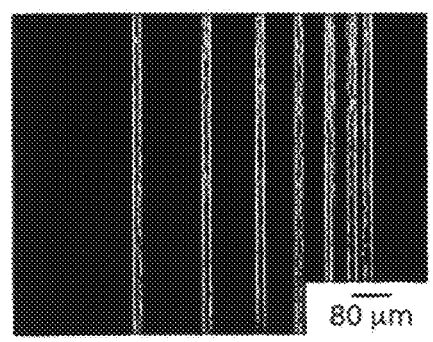

FIG. 13A-13C shows optical images obtained after exchanging the original crosslinking cation for another cation. FIG. 13A shows a fluorescent image ($X_{ex}$=470-490 nm, $X_{em}$>515 nm) of a CCL-PAA/DAH film in which 100-micron-wide squares were etched away. FIG. 13B show an array of 200-micron diameter circles of PAA after exchanging with $Ag^+$ cations and photoreduction with a UV lamp. FIG. 13C shows a CCL-PAA film patterned into an array of lines of different widths with a constant spacing (20 microns). The $Pd^{2+}$ ions replaced the $Al^{3+}$ and reduced to $Pd^0$ upon exposure to an aqueous solution of 0.1 M borane dimethylamine complex (BDC) containing 1 M $CaCl_2$.

Figure 14A:
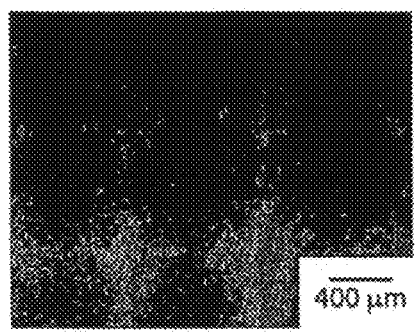
FIGS. 14A-14B show optical images of patterned low-k dielectric films after calcination (FIG. 14A) and ozonation (FIG. 14B) of an ionotropic polymer according to one embodiment of the invention.
Figure 14B:
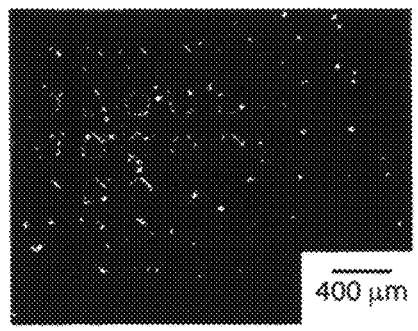
Figure 14C:
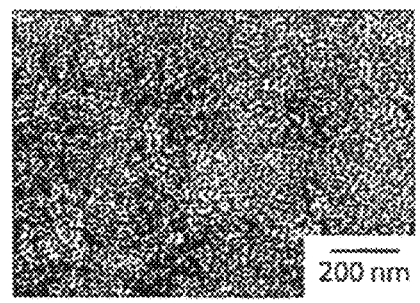
FIGS. 14C and 14D are high magnification SEM images of the films shown in FIGS. 14A and 14B according to one embodiment of the invention.
Figure 14D:
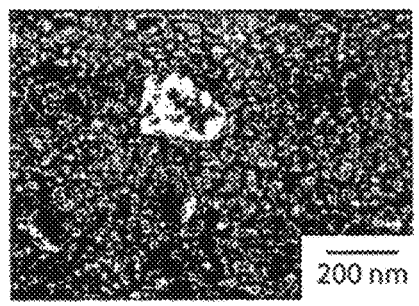
Figure 14E:
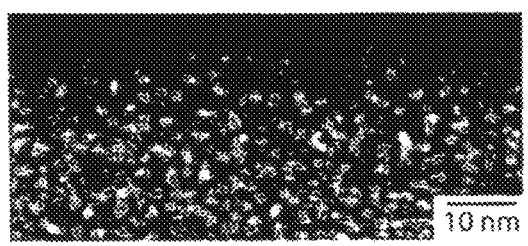
FIG. 14E is a TEM image of the calcined film of FIG. 14C according to one embodiment of the invention.

FIGS. 14A-14B show optical images of patterned low-k dielectric films after calcination (FIG. 14A) and ozonation (FIG. 14B) of CCL-PAA/$Al^{3+}$. The dark-field image of FIG. 14B, the ozonized film, illustrates the rough surface of the resulting film. FIGS. 14C and 14D are high-magnification, SEM images of the calcined (FIG. 14C) and ozonized (FIG. 14D) CCL-PAA/$Al^{3+}$ films and illustrate their porosity. FIG. 14E is a TEM image of the calcined film of FIG. 14C showing that the porosity and grain-size of the film are of similar volumes.

Figure 14F:
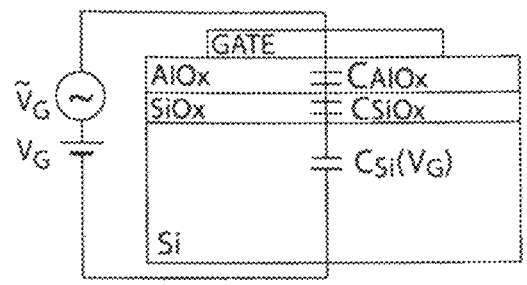
FIG. 14F is a schematic diagram of a MOS structure comprising a film of an ionotropic polymer according to one embodiment of the invention.

In some embodiments, ionotropic polymers described herein can be a part of an electrical device. For example, a layer of ionotropic polymer can be used in a MOS structure, as shown in the exemplary embodiment of FIG. 14F. FIG. 14F is a schematic diagram of a MOS structure comprising a gold electrode (GATE), an ionotropic polymer (e.g., a calcined/ozonized CCL-PAA film to be analyzed ($AlO_x$)), a thermally-grown $SiO_2$ film ($SiO_x$), and a silicon substrate (Si); the equivalent electric circuit for the MOS structure is also provided.

Figure 14G:
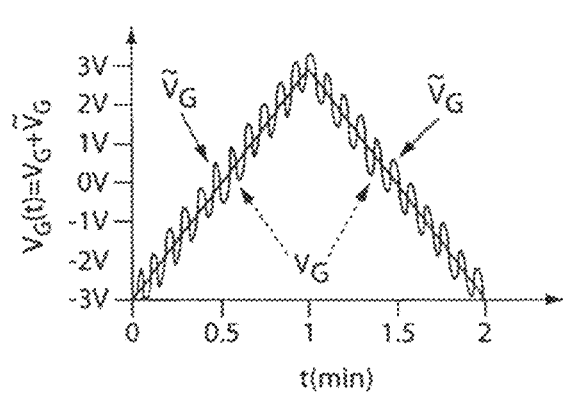
FIG. 14G is a diagram of the electric signal applied to scan the capacitates of the MOS structure of FIG. 14F according to one embodiment of the invention.

FIG. 14G is a diagram of the electric signal applied to scan the capacitance of the MOS structure of FIG. 14F, i.e., $v_G(t)$, which includes a DC signal ($V_G$) and an AC signal ($v_G$).

Figure 14H:
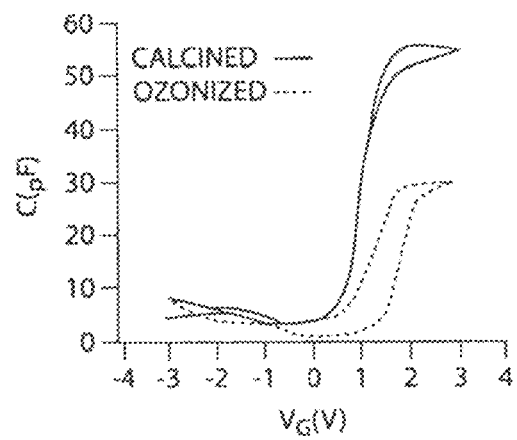
FIG. 14H is a representative curve of different capacitates obtained after scanning the MOS structures that embedded either a calcined or an ozonized film according to one embodiment of the invention.

FIG. 14H is a representative curve of differential capacitance obtained after scanning the MOS structures that embedded either a calcined (solid line) or an ozonized (dashed line) film.

Figure 15:
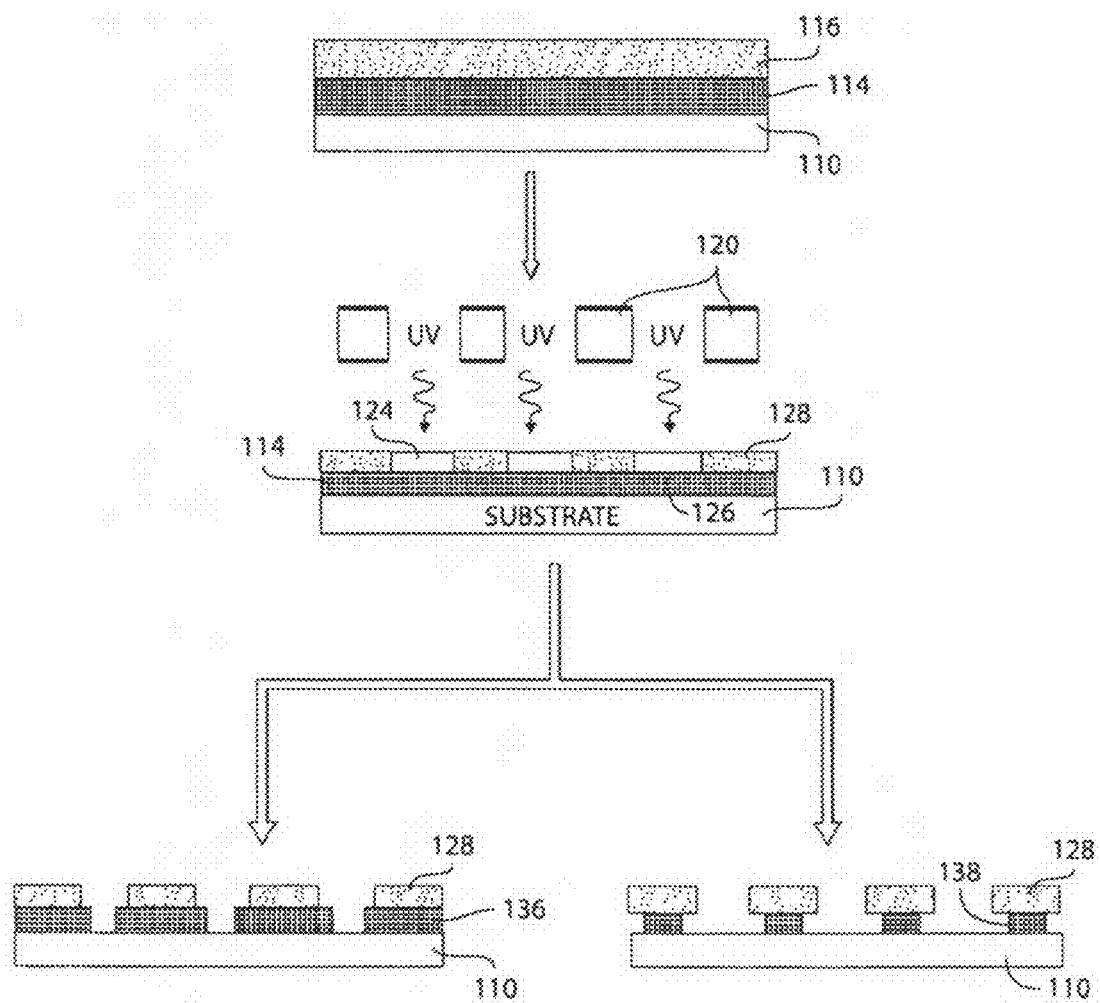
FIG. 15 shows a schematic representation illustrating a method for under-etching or over-etching an ionotropic polymer according to one embodiment of the invention.

FIG. 15 shows a schematic representation illustrating a method for under-etching or over-etching an ionotropic polymer according to another aspect of the invention. The process of underetching can create underetched polymer portions 136; the process of overetching can create over-etched polymer portions 138. These methods can allow fabrication of various patterned structures having a variety of shapes, sizes, and configurations. Photoresist portions 128 can be removed using an appropriate solvent if desired.

Figure 16A:
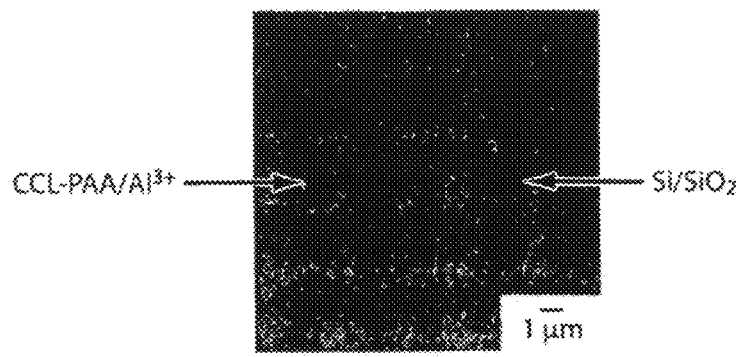
FIGS. 16A-16E show a series of optical, AFM and SEM images that illustrate the roughness of the edges of a patterned ionotropic polymer according to one embodiment of the invention.
Figure 16B:
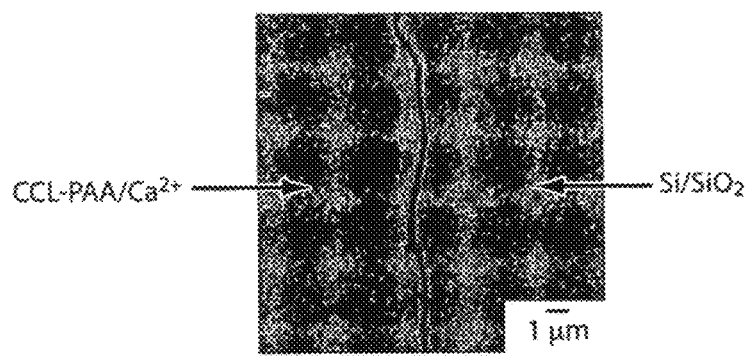
Figure 16C:
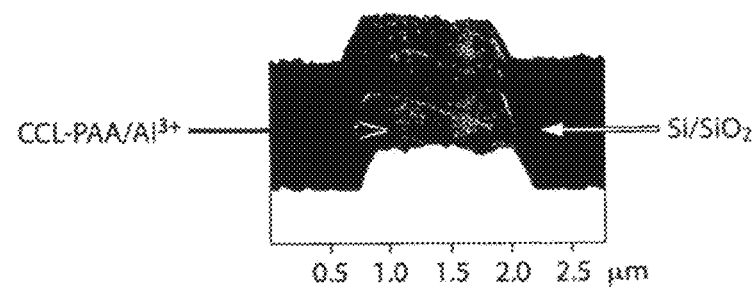

FIGS. 16A-16 E show a series of optical, AFM, and SEM images that illustrate at high resolution the roughness of the edges of the patterned CCL-PAA and low-k dielectric substrate. FIGS. 16A-16B show edges from patterned CCL-PAA/$Al^{3+}$ and CCL-PAA/$Ca^{2+}$ films that used a photoplotted transparency mask. FIG. 16C shows an AFM image of the edge from a set of 1-pm lines that used a chrome photomask and a CCL-PAA/$Al^{3+}$ film. FIG. 16D shows a fluorescent image of the edge roughness after cation exchange with DAH. FIG. 16E shows edge roughness of an aluminum oxide film after ozonation; the processing appears not to alter the edge roughness of the structure.

Figure 17:
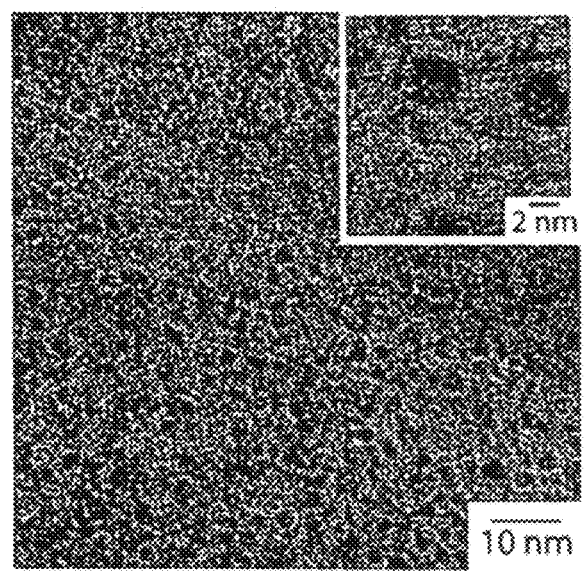
FIG. 17 is a TEM image showing nanoparticles embedded in ionotropic polymer matrix according to one embodiment of the invention.

FIG. 17 shows a TEM image showing Ag nanoparticles embedded in a CCL-PAA/$Ag^+$ matrix. The inset shows a typical particle with a diameter of ~3 nm.

It should be understood that a variety of ionotropic polymers (i.e., polymers that are crosslinked by ions) can be used in accordance with the invention. In some instances, an ionotropic polymer is a hydrogel; that is, the polymer forms a hydrated gel matrix in the presence of an ion (e.g., a metal cation). Non-limiting examples of polymers that can be crosslinked by ions include poly(acrylic acid), poly(methacrylic acid), alginates (e.g., alginic acid (AA)), polymethylacrylate, pectin, cellulose (e.g., carboxymethyl cellulose), polysaccharides (e.g., chitosan, k- and i-carrageenan), polycarboxylates (e.g., poly(bis(4-carboxyphenoxy)phosphazene)), dextran sulfate, polystyrene sulfonate, and poly (vinyl phosphonic acid), poly(acrylamide), poly(ethylene imine), poly(vinyl alcohol), poly(ethylene oxide), poly(ethylene oxide), chitosan, and sucrose. In some embodiments, a polymer that can be patterned by methods described herein includes carboxylateor sulfate groups. In another embodiment, a polymer that can be crosslinked (e.g., with a metal cation) includes anionic groups. Appropriate polymers that can be crosslinked ionically are known or may be determined by those of ordinary skill in the art using routine experimentation.

A variety of crosslinking agents can be used to crosslink ionotropic polymers. In some cases, the crosslinking agent comprises a cation (e.g., a metal cation). Alkaline earth metals, transition metals, and lanthanides can be used as crosslinkers. In other cases, the crosslinking agent comprises an anion. Crosslinkers can be monovalent of mutlivalent (e.g., bivalent, trivalent, etc.). In some embodiments, certain metal salts can crosslink certain types of polymers, but not others.

Table 1 lists a series of metals salts that can crosslink PAA (although others not listed may also be able crosslink PAA). Without wishing to be bound by theory, the inventors believe that in order for a metal cation to crosslink a PAA film, at least two of the ligands in the inner coordination sphere of the metal cation can be replaced by carboxylate groups from PAA. Certain metal salts that crosslink PAA may include salts containing weakly-complexed metal cations, in which the inner-sphere ligands are not tightly bound thermodynamically; salts that do not contain small, highly-charged metal cations and which are not strongly solvated by water or hydroxide; salts containing metal cations that are not kinetically inert to inner-sphere ligand substitution; and salts containing metal cations for which the inner-sphere association with carboxylate ligands in water is thermodynamically favorable.

Generally, suitable polymer and crosslinking agent systems are known in the art; otherwise, one of ordinary skill in the art can determine a suitable system by routine experimentation and using description herein. For example, a simple test may involve mixing a polymer (or polymer precursor) with a crosslinking agent at an appropriate temperature and pressure and observing a change in physical property of the polymer before and after addition of the crosslinking agent. Certain physical properties, such as an increase in viscosity of the polymer, may indicate that the polymer has been crosslinked by the crosslinking agent.

A layer of film of ionotropic polymer can have varying thicknesses on a substrate and in some instances, may determine a cross-sectional dimension (e.g., the height) of a feature formed in the polymer after processing steps. For example, a film may have a thickness of equal to or less than 500 microns, equal to or less than 250 microns, equal to or less than 100 microns, equal to or less than 50 microns, equal to or less than 10 microns, equal to or less than 1 micron, equal to or less than 100 nanometers, equal to or less than 50 nanometers, equal to or less than 40 nanometers, equal to or less than 30 nanometers, equal to or less than 20 nanometers, or equal to or less than 10 nanometers.

A variety of features can be formed using ionotropic polymers such as lines, circles, squares, and irregular shapes. Features can also be formed having a variety of lateral dimensions. According to some embodiments of the invention, at least one feature may be formed with a lateral dimension of less than about 1 mm, less than about 500 microns, less than about 250 microns, less than about 100 microns, less than about 50 microns, less than about 10 microns, less than about 5 microns, less than about 1 micron, less than 0.5 microns, or less than 0.25 microns.

As described herein, one advantage of the methods of the invention include the ability to pattern features on a variety of different substrates. A substrate may include a material having a rigid or semi-rigid surface. In some embodiments, at least one surface of the substrate is substantially flat, although in other embodiments, the substrate may have topographies such as raised regions, etched trenches, or the like. A substrate can have a variety of configurations, e.g., including, but not limited to, planar, non-planar (e.g., curved), a sheet, bead, particle, slide, wafer, web, fiber, tube, capillary, microfluidic channel or reservoir, or other structure.

A variety of different materials may be used as substrates described herein. According to one embodiment, a substrate is formed from a polymeric material. Polymeric materials suitable for use in fabrication of the substrate may have linear or branched backbones, and may be crosslinked or non-crosslinked, depending upon the particular polymer and the degree of formability desired of the substrate. A variety of elastomeric polymeric materials are suitable for such fabrication, especially polymers of the general classes of silicone polymers, epoxy polymers, and acrylate polymers. Epoxy polymers are characterized by the presence of a three-member cyclic ether group commonly referred to as an epoxy group, 1,2-epoxide, or oxirane. For example, diglycidyl ethers of bisphenol A may be used, in addition to compounds based on aromatic amine, triazine, and cycloaliphatic backbones. Another example includes the well-known Novolac polymers.

Examples of silicone elastomers suitable for use as a substrate include those formed from precursors including the chlorosilanes such as methylchlorosilanes, ethylchlorosilanes, and phenylchlorosilanes, and the like. A particularly preferred silicone elastomer is polydimethylsiloxane. Exemplary polydimethylsiloxane polymers include those sold under the trademark Sylgard by the Dow Chemical Company, Midland Mich., and particularly Sylgard 182, Sylgard 184, and Sylgard 186.

Substrates can also be formed of inorganic materials such as silicon and glass.

Microfluidic channels may be formed according to a variety of methods. According to one method, microfluidic channels are micromachined from a material such as semi-conductor. According to another method, microfluidic channels are formed lithographically by providing a substrate, depositing a film of material onto the substrate, coating an exposed surface of the material with resist, irradiating the resist according to a predetermined pattern, removing irradiated portions of the resist from the material surface, contacting the material surface with a reactant selected to react chemically therewith and selected to be chemically inert with respect to the resist such that portions of the material according to the predetermined pattern are degraded, removing the degraded portions, and removing the resist to uncover portions of the material formed according to the predetermined pattern to form the mold surface. Negative or positive resist may be used, and the procedure adjusted accordingly. According to another method of forming a mold surface, a substrate may be provided, and coated with resist. Then portions of the resist may be irradiated according to a particular predetermined pattern. Irradiated portions of the resist may then be removed from the substrate to expose portions of the substrate surface according to the predetermined pattern, and the substrate may be contacted with a plating reagent such that exposed portions according to the predetermined pattern are plated. Then, the resist may be removed to uncover portions of the exposed substrate according to the predetermined pattern bordered by plated portions of the substrate to form the microfluidic channels.

Microfluidic channels according to one embodiment of the present invention may be fabricated as follows. A template consisting of an exposed and developed photoresist pattern on silicon is prepared (This type of fabrication is described in any conventional photolithography text, such as *Introduction to Microelectronic Fabrication*, by Richard C. Jaeger, Gerold W. Neudeck and Robert F. Pierret, eds., Addison-Wesley, 1989). Templates such as electron microscopy grids or other corrugated materials may also be used. The template is placed in a container such as a petri dish. A 10:1 (w:w or v:v) mixture of PDMS-Sylgard Silicone Elastomer 184 and Sylgard Curing Agent 184 (Dow Corning Corp., Midland, Mich.) is poured into the petri dish. The PDMS is cured at room temperature in the laboratory ambient for 30 to 60 min. This cure is followed by additional curing at 65° C. for approximately one hour or until the polymer is rigid. After cooling to room temperature, the PDMS-stamp is carefully peeled from the template and to form microfluidic channels embedded in the PDMS.

The following examples are intended to illustrate certain embodiments of the present invention, but are not to be construed as limiting and do not exemplify the full scope of the invention.

Example 1

Patterning PAA within Microfluidic Channels Using Metal Cation Solutions

This example shows that ionotropic polymers (e.g., PAA) can be patterned using microfluidic channels and metal cation solutions as crosslinkers according to one embodiment of the invention.

The following procedure was used to pattern PAA with microfluidic channels using metal cation solutions. A 3.5% (w/v) aqueous solution (pH 2.5) of PAA (Mw ~50,000) was spin-coated (1500 rpm for 15 seconds) onto either a silicon wafer or a glass slide pre-treated with oxygen plasma using a plasma cleaner (~266 Pa, 100 W, Harrick Scientific Model PDC-32G) for 1 minute. The film was then heated for 15 minutes at 150° C. on a hot plate. A second layer of 3.5% PAA sodium salt (pH 7.2) was spun (1500 rpm for 15 seconds) onto the first layer of PAA, and heated for 2 minutes at 150° C. The first layer of PAA (pH 2.5) increased the strength of adhesion of the PAA film to the substrate. The total thickness of the PAA film was ~350-500 nm (determined by AFM, see FIGS. 5A,B). The solution of PAA at pH 7.2 contained deprotonated carboxylate functionalities (the pKa of PAA is 5-6 depending on the polymer concentration and the ionic strength).

A PDMS microfluidic channel was fabricated using the techniques of soft lithography. An array of microfluidic channels molded in PDMS (the flexible PDMS "slab") was plasma-oxidized, and brought into conformal contact with the PAA film. This contact was reversible: the slab could be removed from the surface easily at any point during the experiment. External pressure applied between the top of the PDMS slab and the underlying substrate with a vice prevented leakage from the channels during the patterning process. A drop of a 1 M or saturated solution of the crosslinking cation (typically 7:3 solution of methanol and water) was drawn into the channels by capillarity without applying external pressure and allowed to remain for 5 minutes. The drop included one of the solutions of metal cations—either $La(NO_3)_3 \cdot 6H_2O$ (1M), $BaCl_2$ (1M), $PbAc_2$ (1M), $Ho(NO_3)_3 \cdot 5H_2O$ (1M), or $PdSO_4$ (saturated) in methanol/water (v/v, 70/30), or $ZnAc_2$ in water (pH ~7). The ionic solutions crosslinked the underlying PAA film in less than five minutes.

The $MeOH/H_2O$ mixture dissolved most metal cations with the choice of an appropriate anion. The maximum solubility of PAA in $MeOH/H_2O$ is less than that in water alone, so crosslinking could be limited to the regions of PAA directly under the microfluidic channel. In some cases, the PAA could be crosslinked with high pattern fidelity, e.g., using zinc acetate in an aqueous solvent (zinc acetate is insoluble in a water/methanol solution, see FIG. 5D). In other cases, e.g., when water alone was used as the solvent, penetration of metal ions under the PDMS template was observed through the PAA matrix; this "undercutting" resulted in crosslinking of the PAA film beyond the confines of the channel geometry.

The PDMS/PAA was baked at 90° C. until the sample was dry, the PDMS slab was removed, and the PAA film was rinsed with methanol to remove excess salts; these steps did not dissolve the PAA film. Rinsing the PAA film with 18 M6 water (pH 7.4) dissolved and removed the uncrosslinked polymer. Large-area, continuous, patterned structures of cationic crosslinked-PAA (CCL-PAA) commensurate with the geometry of the microfluidic channels resulted after removal of the uncrosslinked PAA with water (FIG. 2). Lines of polymer greater than 2.5 cm long were produced (see FIG. 2A and FIGS. 5C-5D). The roughness of the edge along this long channel was a few microns; this resolution is determined by that of the transparency photomask from which the microfluidic channels were replicated (see inset to FIG. 2A). The cross-section of a PAA feature, as measured by AFM, was flat with a surface roughness (RMS) of 6 nm, and its profile showed a well-defined step (FIGS. 5A-5B). Curved PAA features were also produced (FIG. 2B), as well as lines as thin as 500 nm (FIGS. 2C,D). The resolution of the patterning may be limited by the resolution of the chrome mask used to fabricate the channels.

The patterned CCL-PAA could be etched by exposing it to an aqueous solution containing either an excess of non-crosslinking metal cations (NaCl, 1M) or a metal chelator (EDTA, 10 mM, pH 8.2) for less than five minutes at room temperature. These solutions uncrosslinked the patterned CCL-PAA, and allowed the PAA structures to dissolve.

All optical images of the PAA structures were obtained on a Leica DMRX microscope; AFM images were collected in tapping mode with a Digital Instruments Dimension 3100 Nanoscope, and analyzed using the Nanoscope IV v5.12b18 software.

Example 2

Formation and Characterization of Pd, PbS, and ZnS Nanoparticles in the PAA Matrix This example shows that the PAA features produced in Example 1 can be used as templates for nanoparticle growth according to one embodiment of the invention.

The reduction of Pd(II) into metallic colloids (Pd(0)) is one especially practical example of the chemistry that can be done with the patterned, crosslinking metal ions: Pd(0) can reduce precious metal cations such as Au(III), and provides a catalytic surface for other chemical reactions (e.g., the reduction of Cu(II)). Both of these applications are now described.

Two different reducing agents were used to convert the Pd(II) embedded in the PAA matrix to Pd(0) nanoparticles: methanol, a mild reductant, and a 0.1 M aqueous solution of BDC (in the presence of 1M $CaCl_2$, a replacement cation), a stronger reductant than methanol. Reduction of the CCL-PAA/Pd(II) by BDC without the replacement cation in solution resulted in dissolution of the polymer film. Other cations, such as Zn(II) or La(III), could also be used as replacements for Ca(II). The reductants were introduced to the crosslinked PAA in two ways: i) Before removing the PDMS slab, the channel and CCL-PAA were rinsed with methanol and then a drop of the MeOH or BDC solution was placed at one end of the channel; the drop was drawn into the channel by capillarity (as occurred with the solutions of metal ions). ii) After removing the PDMS slab from the support, and rinsing with methanol and water, a drop of the reductant was placed on top of the patterned polymer. The CCL-PAA/Pd(II) film was exposed to the BDC solution for two minutes to allow complete reduction of the palladium cations. The reduction of Pd(II) by BDC was marked by the evolution of $H_2$ gas from a side reduction of water (according to the reaction $BH_3 + H_2O \rightarrow B(OH)_3 + H_2(g)$). For both MeOH and BDC, after reduction, the film appeared darker than the pre-reduction film due to the presence of the colloids.

XPS measurements confirmed the presence of palladium on the surface of the PAA film (FIG. 6), and a TEM image (using a JOEL 2100 instrument, 200 kV) of the cross-section of the film showed that the Pd(0) colloids were distributed throughout the thickness of the entire PAA film (FIG. 3A). FIGS. 3A and 3B are top-view TEM images of PbS and ZnS nanoparticles embedded in the PAA matrix prepared by reacting the crosslinking cations (Pd(II) or Zn(II)) with 10 mM $Na_2S$ solution in the presence of 1M $CaCl_2$, for 5 minutes. The nanoparticles in were approximately 4±1 nm in diameter.

FT-IR measurements were obtained using a Nexus 670 instrument. UV-Vis absorption spectra were obtained using a Hewlett Packard 8453 instrument and XPS measurements were obtained using a Surface Science SSX-100 instrument.

Example 3

Chemical Reactions with Patterned Pd(0) Nanoparticles

This example shows that patterned ionotropic polymers can be used for associating a chemical and/or biological component.

Reduction of [$NaAuCl_4$] to Au(0) Nanoparticles.

After reduction of the Pd(II) to Pd(0) using either methanol or BDC, the PAA film containing Pd(0) colloids was exposed to a solution of 0.5 M $NaAuCl_4$ for 30 minutes. During reduction of gold, the PAA film acquired a red color when MeOH was used as the reductant, or a blue color when BDC was used as the reductant; the red color indicated the presence of gold colloids, and the blue color indicated the presence of their aggregates. XPS and UV-Vis absorption measurements (see FIGS. 6 and 9, respectively) confirmed these assignments. The color of the Au particles was determined by the method by which the Pd(II) was reduced. The use of MeOH may have yielded mainly individual Au nanoparticles because it is, a weak reducer of Pd(II). Reduction with MeOH produced Pd(0) nanoparticles (and, subsequently, Au nanoparticles) that were spaced by an average distance great enough to have an absorption spectrum characteristic of individual particles (FIG. 9A). Conversely, since BDC is an excellent reducing agent of Pd(II), it yielded a high density of Pd(0) colloids that, upon reduction of Au(III), led to aggregated Au nanoparticles (FIG. 9B).

Catalytic Reduction of Cu(II) for Electroless Deposition of a Cu Film.

After crosslinking the PAA with Pd(II) within the PDMS microchannels, an aqueous solution containing a 0.1 M BDC and 1 M $CuSO_4$ was injected into the channels now containing the CCL-PAA/Pd(II) film (FIG. 4). This procedure resulted in the reduction of Pd(II) and Cu(II) to yield (after rinsing with water) a continuous copper/crosslinked PAA film with a sheet resistance of ~20 Ohms/sq. Bubbles of $H_2$ gas evolved as the Cu(II) was reduced to Cu(0) (FIG. 4B, indicated by arrows); this evolution of gas was enhanced in the presence of a metallic surface (Pd(0) and Cu(0)). Upon completion of the reduction, the PAA film was no longer transparent and gas evolution ceased (FIG. 4C). This process of reducing Cu(II) with BDC in the presence of CCL-PAA/Pd(II) can also be accomplished without the PDMS microfluidic system (FIG. 10). In solution, BDC reduces Pd(II) to Pd(0) more rapidly (~1 s) than it reduces Cu(II) to Cu(0) (on the order of hours). The reduction potential corresponding to direct reduction of Cu(II) by Pd(0) is negative ($E^0 = -0.61$ V), implying that this reaction is not spontaneous. It is hypothesize that the reduction of Cu(II) by BDC in the presence of Pd(II) that was observe was a catalytic process: the BDC initially reduces the Pd(II) to Pd(0), and the presence of Pd(0) catalyzes the reduction of Cu(II) to Cu(0) by BDC.

Example 4

Patterning of Ionotropic Polymers Using Photolithography

This example shows a process used to pattern CCL-PAA films using photolithography.

A layer of PAA (Mw ~100,000; Aldrich) adjusted with KOH (Fluka) to 3.5% w/v and a pH ~2.5) was spin-casted (1500 rpm for 15 seconds) onto either a silicon or glass substrate that had been treated with an air plasma (~266 Pa, 100 W, Harrick Scientific Model PDC-32G for 1 minute), and baking this layer at 150° C. for 15 minutes. A second layer of PAA (3.5% w/v, pH ~7.2) was then spun onto the initial layer and baked at 150° C. for 2 minutes to remove the water. Successive deposition of two layers of PAA was gave good adhesion of the neutral layer to the substrate; the carboxyl groups in PAA (pH 2.5) react at 150° C. with surface hydroxyl groups and form ester bonds.

After the two layers of PAA were spun-cast and baked, the substrate was immersed in an aqueous solution containing a metal salt (typically 1 M) for 1 minute. The film was rinsed with water and dried under a stream of $N_2$.

Patterning.

Onto the CCL-PAA film was spun-cast a film of positive photoresist (either S1813 or S1805 (Rohm and Haas), a diazonaphthoquinonenovolac resin) depending on the size the features desired) at 500 rpm for 5 seconds and 3000 rpm for 30 seconds. After baking the photoresist for 3 minutes at 110° C., it was exposed for 3 seconds through an appropriate photomask (either a transparency mask or a chrome mask) to UV radiation with an AB-M mask-aligner. CCL-PAA is insoluble in organic solvents and is not affected by spin-casting or patterning of the photoresist. The thickness of the photoresist film was ~1.5 microns for the larger features (>10 microns), and ~500 nm for the smaller features (<1 micron).

After UV exposure, the photoresist and the CCL-PAA films were developed using wet-etching. PAA films crosslinked with either $Al^{3+}(Al_2(SO_4)_3 \cdot 12H_2O)$ or $Ca^{2+}$ ($CaCl_2$) could be etched completely by exposing them to the commercial photoresist developer (a solution of 0.7 M NaOH) for 4-10 seconds at 20° C. The substrates were developed in a 0.7 M NaOH solution (Microposit 351 developer (Rohm and Haas) diluted 1:1 with water) for 4-10 seconds, depending on the crosslinking metal. The substrates were rinsed with deionized water and dried under $N_2$. Afterwards, if necessary, the substrates were immersed in an aqueous 0.5 M EDTA solution (pH 8.2, Sigma) in order to etch the CCL-PAA film. Finally, we rinsed the substrates with acetone to remove the undeveloped photoresist and to yield a patterned CCL-PAA film. All optical images were obtained on a Leica DMRX microscope; AFM micrographs were collected to in tapping mode with a Digital Instruments Dimension 3100 Nanoscope, and analyzed using the Nanoscope IV v5.12b18 software.

This developer alone did not etch films crosslinked with $Ag^+(AgNO_3)$, $Ho^{3+}(Ho(NO_3)_3)$, $La^{3+}(La(NO_3)_3)$, or $Pd^{2+}$ ($PdSO_4$). Exposure of the CCL-PAA/$Ag^+$ film to the developer yielded a surface with a precipitate in the etched regions of the polymer. This precipitate may be insoluble $Ag_2O$. For CCLPAA/$Ho^{3+}$ films, the rate of etching the polymer film was sufficiently slow that the photoresist was completely removed by the developer before the polymer film was properly etched. (FIG. 15) The CCL-PAA/$La^{3+}$ film showed no signs of etching even after 10 minutes in the 0.7 M NaOH solution, while the CCL-PAA/$Pd^{2+}$ films etched more rapidly than the photoresist, and thus were over-etched. (FIG. 15)

For those CCL-PAA films that could not be etched by the 0.7 M NaOH solution, an additional step was required. After removing the photoresist from the regions exposed to UV light with the developer, the samples were immersed in an aqueous solution containing 0.5 M EDTA (pH 8.5); this solution etched the areas of the CCL-PAA film exposed through the windows opened in the photoresist. The use of a competitive and stronger chelator than the carboxylates in the PAA extracted the crosslinking metal cations, and yielded water-soluble, uncrosslinked PAA. The combined use of developer and EDTA solution successfully etched the CCL-PAA/$Ho^{3+}$ and CCL-PAA/$La^{3+}$ films. The aqueous EDTA solution also removed the precipitate from the $Ag^+$ films, and yielded a clean pattern of well-defined features.

Using optimized conditions for the specific metal cation, the etchant slightly over-etched the CCL-PAA film, in general. AFM showed that the difference between 22-μm-wide lines in the photomask and the features in the CCL-PAA films were <1 μm. The degree of over-etching did not depend on the crosslinking cation: similar results were measured for CCL-PAA crosslinked with $Ag^+$, $Ca^{2+}$, $Al^{3+}$, $Ho^{3+}$ and $La^{3+}$.

Fluorescent imaging.

For imaging the films with a fluorescent molecule embedded in the CCL-PAA matrix, a mercury lamp with an arclamp power supply (LEP Ltd.) was used. The images were recorded by a Hamamatsu ORCA-ER camera with exposure times of 200 milliseconds for the rhodamine B film. For imaging the CCL-PAA/DAH films, a CCD camera (Nikon DXM1200) was used with excitation and emission filters of $X_{ex}=470$-490 nm and $X_{em}>515$ nm respectively and exposure times of 20 milliseconds.

Example 5

Post-Patterning Modifications and Applications of Ionotropic Polymers

This example shows that post-patterned ionotropic polymers can be used for associating a chemical and/or biological component.

Cation reduction. The CCL-PAA/$Ag^+$ film of Example 4 was reduced under a UV lamp (long-wave mercury lamp, 100 W) for 20 minutes. An aqueous solution (10 mL) containing 0.1 M borane dimethylamine complex (CAS 74-94-2, Strem Chemicals) and 1 M $CaCl_2$ reduced the CCLPAA/$Pd^{2+}$ film in 1 minute.

Figure 16D:
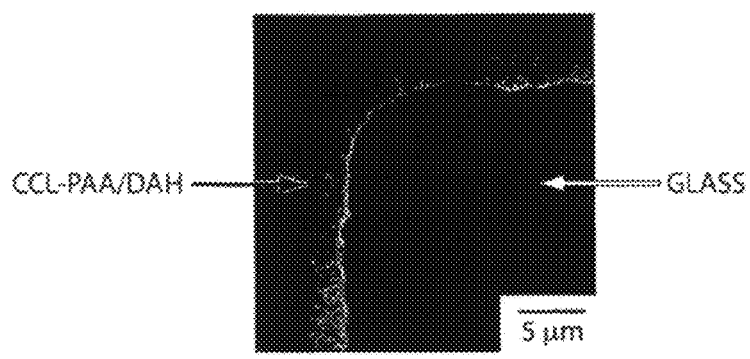

Ion exchange. Soaking either CCL-PAA/$Al^{3+}$ or CCL-PAA/$Ca^{2+}$ films of Example 4 in a solution containing a different metal cation resulted in ion exchange. A CCL-PAA film was immersed in 10 mL of a concentrated aqueous solution (typically 1 M) of the replacing cation for a minimum of 30 minutes. The original cations—both $Al^{3+}$ and $Ca^{2+}$—were exchanged with other metal cations such as $Pd^{2+}$ and $Ag^+$. The $Al^{3+}$ cation in a CCL-PAA/$Al^{3+}$ film on a glass substrate was also exchanged with a cationic organic dye, DAH. The polymer film (~5 $cm^2$) was allowed to soak for 1 hour in 10 mL of an aqueous, saturated solution of the dye before rinsing and drying the film. The resulting polymer film was translucent under white light and highly fluorescent when excited. (FIG. 13A) The edge roughness remains similar after exchange (FIG. 16D). After soaking the fluorescent CCL-PAA/DAH overnight in an aqueous 100-mL solution of 1 M $Al_2(SO_4)_3$ in the dark, the CCL-PAA film remained insoluble, but the film was no longer fluorescent. This observation indicates that the cation exchange in these films is reversible.

The cations present in the CCL-PAA film were accessible for further chemical reactions. The CCL-PAA/$Ag^+$ and CCL-PAA/$Pd^{2+}$ films were tested for reduction of the metal cation. Exposure of the CCL-PAA/$Ag^+$ film to UV light for 20 minutes yielded a brown film (FIG. 13B). (This procedure is a common method for the photoreduction of silver cations to silver nanoparticles.) The presence of nanoparticles was confirmed using a TEM (FIG. 17); the average size of a particle was 3 nm. After photoreduction, the film retained its integrity and insolubility in both water and an aqueous solution of 1 M NaOH. A CCLPAA/Al$^{3+}$ film exposed to UV light for 20 minutes was soluble in 1 M NaOH. It is hypothesized that the photoreduction of Ag$^+$ created radicals in the PAA polymer (due to an excited state silver ion abstracting a hydrogen atom from the polymer); and these radicals caused the polymer to crosslink; this crosslinking may make the remaining CCL-PAA/Ag$^+$ insoluble, and thus resistant to etching.

A CCL-PAA/Pd$^{2+}$ film was exposed to a reducing solution containing 0.1 M borane dimethylamine complex (BDC) and 1 M CaCl$_2$ in water (pH ~8) for 1 minute (FIG. 13C). During the reduction, the color of the PAA film changed to a dark grey, and gas bubbles evolved at its surface. In addition to BDC, the solution should contain a cation (here Ca$^{2+}$) that is able to crosslink the chains, and is not reduced by the BDC, in order to keep the CCL-PAA crosslinked: in the absence of Ca$^{2+}$, the CCL-PAA/Pd$^{2+}$ film delaminated, and partially dissolved. The BDC reduced most of the Pd$^{2+}$ cations, and thus reduced or eliminated the crosslinks in the PAA film. It is believed that the Ca$^{2+}$ cations in the solution replaced the Pd$^{2+}$ cations that became Pd(0) colloidal particles to maintain the crosslinking of the polymer film. (Equation 1) In the presence of Ca$^{2+}$ cations, it was observed that the polymer film that remained on the substrate was insoluble in water after reduction of the Pd$^{2+}$.

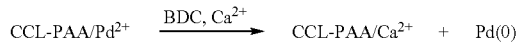

(1)

Low-k Dielectric Films.

Figure 16E:
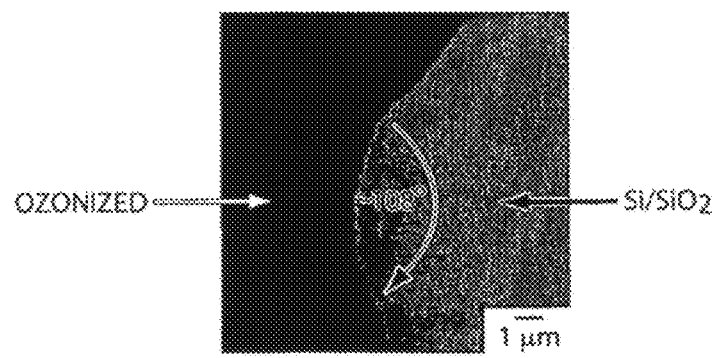

Before spin-casting the PAA films, the silicon wafers were etched for 1 minute in HF (~5%) followed by a UV/ozone treatment for 3 minutes. For fabricating patterned low-k dielectric films, the CCLPAA/Al$^{3+}$ films were either calcined at 750° C. for 4 hours in air or treated by UV/O$_3$ for 3 hours to remove the polymer film: these oxidations yielded an insulating, inorganic, patterned film. (FIGS. 14A and 14B) The thickness of the film before decomposition of the polymer was ~300 nm; the final thickness of the residual metal oxide was 21-27 nm with an average thickness of ~23 nm for the calcined film, and 46-53 nm with an average thickness of ~49 nm for the ozonized film, as determined by both profilometry and AFM. The planar patterned geometry and edge roughness in the CCL-PAA after calcination and ozonation remained similar to that of the original CCL-PAA film (FIG. 16E). The SEM images of the Al$^{3+}$-containing structures show a rough, porous surface (FIGS. 14C and 14D). A significant amount of charging of the surface occurred from the electron beam irradiation during the SEM imaging, as is expected for a dielectric material.

Gold electrodes (with an area of 5.6·10$^4$ m$^2$, and a thickness of ~25 nm) were evaporated onto the sample through a hard mask using a sputter coater (Cressington 208HR). A gold contact (~25 nm) was evaporated onto the back of the silicon substrate to ensure ohmic contact between the Si and the probe during measurements. Capacitance was measured on a probe station (Sigmatone) with a LCR meter (HP 4275A). The thickness of the SiO$_2$ layer was measured by ellipsometry (Rudolph Research AutoEL) at 632.8 nm.

For characterizing the film electrically after calcination or ozonation, a metal oxide semiconductor (MOS) capacitance was used. On an n-type silicon wafer, a porous film of aluminum oxide was prepared onto which a patterned layer of gold was deposited. The resulting MOS structure (FIG. 14E) included two dielectric layers embedded between a semiconductor substrate (e.g., silicon) and a metal electrode (e.g., gate). The top dielectric layer (AlO$_x$ in FIG. 14E) was the calcined or ozonized CCL-PAA/Al$^{3+}$ film we prepared; the lower dielectric was a layer of silicon oxide (SiOx in FIG. 14E) grown naturally on the silicon substrate during calcination/ozonation of the sample in an air atmosphere. The total capacitance (C) of the MOS structure can be obtained by combining the capacitances of each of the dielectric layers (CAlO$_x$ and CSiO$_x$) and that of the silicon substrate (CSi) in series:

$$\frac{1}{C} = \frac{1}{C_{AlOx}} + \frac{1}{C_{SiOx}} + \frac{1}{C_{Si}} \quad (2)$$

The capacitances associated with the dielectric layers (CAlO$_x$ and CSiO$_x$) were considered to be constant because the applied voltages were far from the breakdown voltage of these layers. The capacitance of silicon (CS i) depends dramatically on gate voltage (vG), since it determines the charge of the interfacial region of silicon, i.e. the region of the silicon substrate adjacent to the layer of silicon oxide.

In the most general case, the gate voltage has both DC (gate bias, VG) and AC (Gv~) components: =VG+VG. For our measurements, we applied a gate bias (VG) ramping from –3 V to 3 V and back to –3 V at 0.1 V/sec, and an AC voltage (v~G, amplitude 0.1 V and frequency of 4 MHz), superposed to the DC ramp. Each component of the applied gate voltage determines a different type of capacitance. The gate bias sets the quasi-static polarization point of the MOS structure that establishes its static capacitance ($C_{stat}$=QT/V$_G$, where QT stands for the total charge of the interfacial layer); C sets the high frequency considerations for evaluating the differential capacitance (C=dQT/dV$_G$) of the MOS structure. The static and differential capacitances can be very different due to the nonlinear response of an MOS structure to gate voltage. Of the two, the differential capacitance is the parameter of interest in applications of signal processing (high operation frequency and small amplitude) because it provides the rate of change of charge with voltage.

FIG. 14H shows a typical curve of the differential capacitance measured for MOS structures containing either a calcined or an ozonized aluminum oxide film. When a positive gate bias (V$_G$>0) was applied, positive charges collected at the interface between the metal gate and the top dielectric (here, aluminum oxide) and attracted negative charges from the silicon substrate to the interface between silicon and the bottom dielectric layer (here, silicon oxide); the dielectric layers prevent the actual flow of charges between gate and silicon. Therefore, after applying V$_G$>0, electrons (e.g., the majority carriers in n-type silicon) accumulated at the silicon interface layer, which yielded the MOS capacitance under accumulation. At high positive voltages, the density of electrons at the interface became so high that the capacitance associated with the interface became much greater than that of the dielectric layers such that eq. 2 could be simplified to eq 3:

$$\frac{1}{C} \approx \frac{1}{C_{AlOx}} + \frac{1}{C_{SiOx}} \quad (3)$$

As discussed, capacitance of dielectric layers does not depend on the applied gate voltage; at V$_G$>0, C tended to stabilize to its highest value and the curve in FIG. 14E reached a plateau. As the gate bias decreased, electrons were less attracted to the silicon interface; the charge at the interface decreased, as did the interface capacitance. As CSi became comparable to the capacitance of the dielectric layers, the curve of capacitance started to decrease, leaving the plateau. A negative gate voltage ($V_G$<0) would accumulate negative charges in the metal gate and repel electrons, thus depleting the interface silicon layer of majority carriers. This situation is known as the depletion state of the MOS capacitor. By applying a negative voltage of larger magnitude ($V_G$<<0) than that required for repelling the electrons, minority carriers (holes) were attracted to the silicon interface in order to balance the increased negative charge collected at the gate. Thus, large negative voltages created, at the silicon interface, a layer of net charge with sign opposite (positive) to that of the majority carriers (negative), which yielded the MOS capacitance to its inversion state. The bias voltage ($V_G$, DC gate voltage) drove minority carriers to accumulate at the interface, and increased the static capacitance (Cstat) of the silicon interface. The differential capacitance (c), though, is determined by the ability of charges to follow the oscillations of the AC gate voltage (Vg), i.e. by the charge carrier response time, which depends inversely on the local volumetric density of charge carriers. The response time of majority carriers will be much higher than that of minority carriers for a given v,~. At the frequency used in the measurements (4 MHz), majority carriers could follow the AC gate voltage (Vg), but minority carriers could not respond as rapidly as required by Vg. The curves shown in FIG. 14E agree with the previous statement: while at positive bias voltages the accumulation of majority carriers at the silicon interface led to a large value of c, at negative v, the accumulation of minority carriers resulted in a $c_s$; smaller than that of the dielectric layers. As a consequence, the differential capacitance of the MOS structure reaches its minimum value in inversion, dominated by the capacitance of the silicon interface (eq. 4):

$$C \approx C_{Si} \quad (4)$$

In order to determine the dielectric constant (k) of the aluminum oxide layer, the value of C at $V_G$=3 V was used (FIG. 14H), where Eq. 3 is valid and C depends only on the capacitance of the dielectric layers. We can model each of the dielectric layers as a planar capacitor, where d stands for the thickness of the dielectric layer, A for the area of the electrode (5.6~$10^{-8}$ m$^2$), and $\varepsilon_o$ for the permittivity of free space (8.85× $10^{-12}$ F m$^{-1}$) (eq. 5):

$$k = \frac{C \cdot d}{\varepsilon_0 \cdot A} \quad (5)$$

It was determined that the thickness of the silica interfacial layers by ellipsometry was: d=10.5 nm for the calcined film and d=3.2 nm for the ozonized film. First, $C_{Siox}$ was obtained after substituting $k_{SiO2(4)}$, $\varepsilon_o$, $d_{SiOx}$, and A in eq. 5. Second, $C_{AlOx}$ was calculated from Eq. 3 and the values of $C_{Siox}$ and C at 3 V. Last, the dielectric constant of the aluminum oxide film ($k_{AlOx}$) was determined from eq. 5, $k_{AlOx}$~3.5 for the calcined films and ~3.2 for the ozonized films.

FIG. 14E shows that the maximum value of capacitance reached by the calcined sample is about twice that reached by the ozonized sample. Since the dielectric constants calculated for both samples are similar (3.5 and 3.2), and according to eq. 5, the difference in the maximum values reached by each sample reflects the fact that the thickness of the aluminum layers in the calcined film being about half the thickness of the ozonized film—as detailed above, ~23 nm and ~49 nm, respectively. Also, the calcined film showed less hysteresis than that of the ozonized film. Hysteresis in measurements of MOS capacitance measurements is the consequence of the presence of dopant impurities trapped in the dielectric layer. These species, after becoming polarized by an initial gate voltage, require a larger gate voltage opposing the initial one in order to reorient. Hysteresis is undesirable for many electronic applications of low-k dielectric films, as it forces a wider operating voltage range to reverse the stored charge across a capacitor.

Current leakage in dielectric materials can be quantified by dispersion, which is defined as the ratio of the real to the imaginary component of the complex impedance; an ideal capacitor with no leakage would have a dispersion of zero. Lower dispersion values were measured for the calcined film (~0.6) than for the ozonized film (~2.8); both values were less than the typically accepted upper limit for current leakage (typically <3). Some of the increased leakage for the ozonized film can be attributed to a thinner underlying SiO2 layer (3.2 nm) than in the calcined samples (10.5 nm).

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, to the term "or" as used herein shall only be interpreted as indicating exclusive alternatives (i.e. "one or the other but not both") when preceded by terms of exclusivity, such as "either," "one of," "only one of," or "exactly one of." "Consisting essentially of", when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method comprising:
   flowing a fluid through one or more microfluidic channels in a process to selectively affect the crosslinking character of a first portion of an ionotropic polymer while blocking a second portion of the ionotropic polymer from the fluid, such that the second portion remains essentially free of contact with the fluid.

2. A method as in claim 1, further comprising:
   providing an ionotropic polymer defining a surface;
   positioning a microfluidic device proximate the surface thereby defining at least one channel communicating with a first portion of the surface;
   exposing the first portion of the surface to a fluid, via the channel, the fluid comprising an ionic species, while blocking a second portion of the surface from the fluid such that the second portion remains essentially free of contact with the fluid; and
   allowing the fluid to remain in contact with the first portion of the surface for a period of time and under conditions such that ion exchange takes place between the fluid and the polymer thereby affecting the crosslinking character of the first portion of the ionotropic polymer, including the first portion of the surface.

3. A method as in claim 1, further comprising exposing the first portion of the ionotropic polymer to a fluid comprising an ionic species which exchanges with an ionic species in the polymer, thereby affecting crosslinking of the polymer.

4. A method as in claim 1, further comprising allowing the second portion of the ionotropic polymer to be essentially free of the crosslinking effect, and
   associating a chemical and/or biological component selectively with the first portion of the ionotropic polymer to a greater extent than the second portion.

5. A method as in claim 4, furthermore comprising determining the chemical and/or biological component.

6. A method as in claim 4, further comprising forming nanoparticles from material already present in the polymer, at areas where the polymer is exposed to the crosslinking effect.

* * * * *